United States Patent [19]

Kodama et al.

[11] Patent Number: 5,277,723
[45] Date of Patent: Jan. 11, 1994

[54] METHOD FOR PRODUCING MULTILAYER CERAMIC BODY WITH CONVEX SIDE FACES

[75] Inventors: Hironori Kodama; Masahide Okamoto, both of Hitachi; Hideo Suzuki, Katsuta; Satoru Ogihara; Tadahiko Moyoshi, both of Hitachi; Fumiyuki Kobayashi, Sagamihara, all of Japan

[73] Assignee: Hitachi, Ltd., Tokyo, Japan

[21] Appl. No.: 762,933

[22] Filed: Sep. 19, 1991

[30] Foreign Application Priority Data

Sep. 19, 1990 [JP] Japan .................. 2-247574
May 14, 1991 [JP] Japan .................. 3-107950

[51] Int. Cl.$^5$ .................. C04B 37/00; B32B 18/00
[52] U.S. Cl. .................. 156/89; 156/288; 264/61; 264/241; 264/320
[58] Field of Search .................. 156/89, 288; 264/61, 264/241, 320

[56] References Cited

U.S. PATENT DOCUMENTS 4,753,694 6/1988 Herron et al. .................. 156/89
5,085,720 2/1992 Mikeska et al. .................. 264/61

Primary Examiner—Jan H. Silbaugh
Assistant Examiner—Christopher A. Fiorilla
Attorney, Agent, or Firm—Antonelli, Terry, Stout & Kraus

[57] ABSTRACT

A method of producing a sintered multi-layer ceramic body used for ceramic parts of various electronic devices such as multi-layer substrates for LSI packaging and highly functional structural materials and by applying a pressure and/or constraining force to an outermost surface of the laminate. The method is featured by the shape of the surfaces to which a pressure and/or constraining force are not applied, ranges of the pressure and/or the constraining force, and the like.

38 Claims, 16 Drawing Sheets

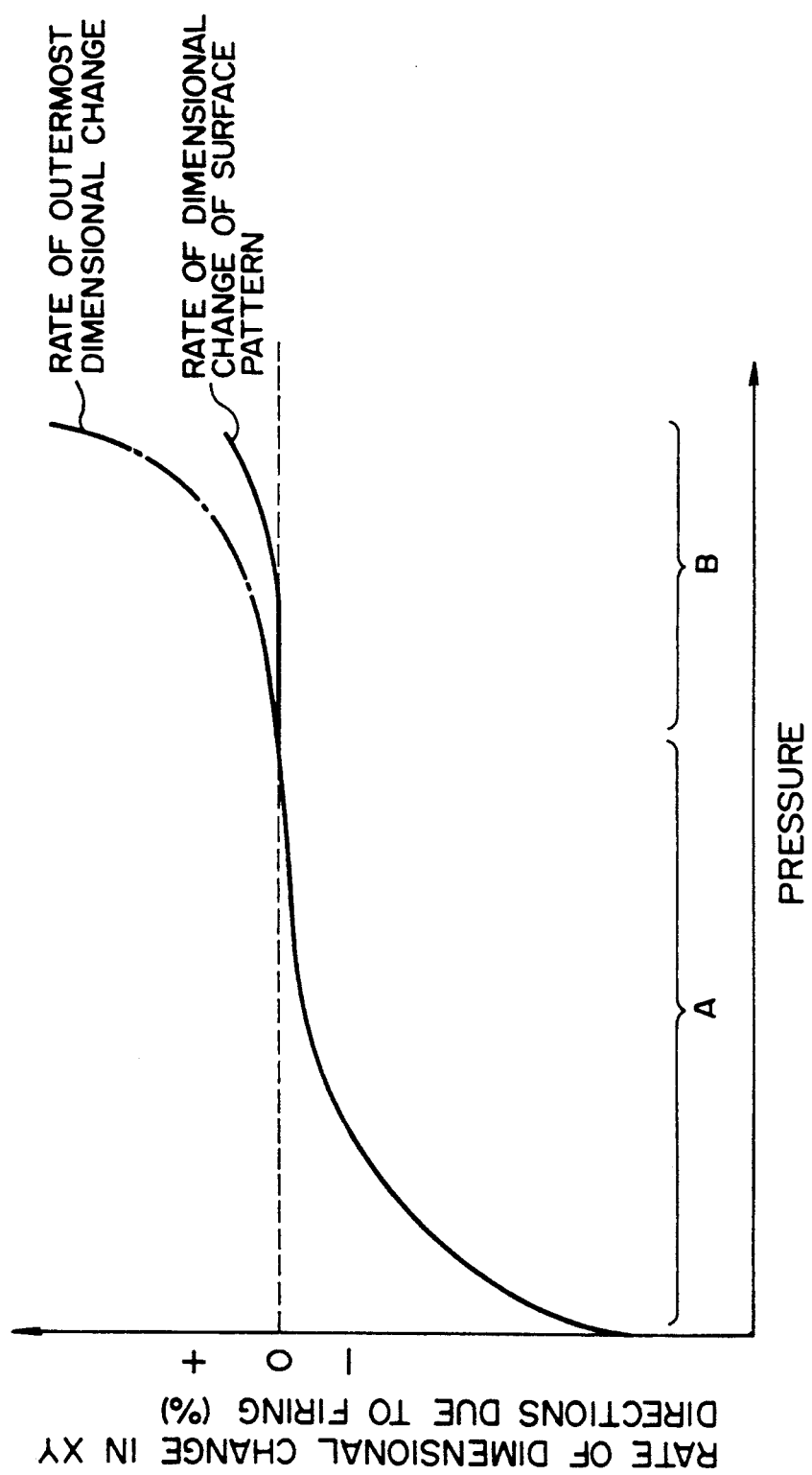

METHOD FOR PRODUCING MULTILAYER CERAMIC BODY WITH CONVEX SIDE FACES

BACKGROUND OF THE INVENTION

1. Field of the Invention

The present invention relates to a sintered multi-layer ceramic body and a method for making the same and in particular, to a sintered multi-layer ceramic body which can assure high dimensional accuracy and high reliability and a method for making the same.

2. Description of Prior Art

Multi-layer technology for ceramics has become essential especially in the fields of electronic industries. For example, mention may be made of techniques such as miniaturization or enhancement of performance of electronic ceramic devices such as multi-layered ceramic capacitors and piezoelectric devices and application to ceramic multi-layer substrates which are essential for high-density packaging of semiconductor devices. These are generally produced by a green sheet method and are known as sintered multi-layer ceramic bodies.

However, ceramics generally undergo a large dimensional change (shrinkage) when sintered, which is apt to be affected by variation of starting materials or processes. Therefore, keeping the dimensional accuracy when sintered at a high level is very difficult. Furthermore, the high dimensional accuracy is also required for a sintered multi-layer ceramic body and especially when the sintered body is used as a multi-layer substrate, a high positional accuracy (surface dimensional accuracy) of wiring formed on the surface of substrate is required since semiconductor chips must be mounted thereon and connection with the chips must be formed. Furthermore, these ceramic substrates are subsequently subjected to operations such as plating, attaching of pins and formation of a thin film layer, and mechanical reliability in these operations is also an important requirement.

Furthermore, when thin film multi-layer wirings must be formed on these ceramic substrates in later steps, it is also an important requirement that the ceramic substrate can be set on a device for the production of thin film circuits with high accuracy. In such case, since the substrate is set based on the periphery of the substrate, it is necessary that the external size (maximum size) and peripheral shape of the sintered body are high in accuracy.

In general, a multi-layer ceramic laminate is fired without application of load (pressureless firing). This has merits of simplicity and low costs, but it cannot avoid uneven shrinkage upon firing and it is very difficult to stabilize surface dimensional accuracy to a large extent. Especially when the laminate has complicated conductor layers therein, it is difficult to assure the dimensional accuracy and besides, occurrences of warpage, peeling and blister are severe problems.

For these problems, Japanese Patent Kokai Nos. 57-32657, 62-5848 and 63-31754 have proposed methods of applying a small load of 0.5-20 g/cm$^2$ to the laminate in firing thereof. According to these methods, warpage, peeling and blister of the laminate can be diminished without hindering the firing shrinkage of the laminate, but uneven firing shrinkage cannot be simultaneously diminished. Therefore, these methods cannot assure the high dimensional accuracy.

Japanese Patent Kokai Nos. 60-137884 and 1-225546 disclose methods of sintering the ceramic laminate under application of a load of 25-200 kg/cm$^2$ for inhibition of shrinkage at the sintering. However, according to these methods, a frame must be used in firing in order to sinter the laminate without causing substantially any change in surface dimension. If the laminate is sintered with its side faces being free without using the frame, in fact, the sintered body is collapsed owing to the very large load and the accuracy of the surface and external dimensions of the sintered body cannot be ensured (its shape cannot be retained). On the other hand, when firing is carried out using the frame, the sintered body is reacted with the frame material and adheres to the frame, resulting in the side faces of irregular shapes or the frame material bonds firmly to the sintered body which necessitates grinding to remove the frame material or there occur severe problems in costs and operability because the frame must be thrown away after use.

On the other hand, Japanese Patent Kokai No. 62-260777 discloses a method of sintering the laminate under application of a medium pressure between those employed in the above two methods, to thereby avoid shrinkage in XY plane, upward warpage and distortion. This method can inhibit sintering shrinkage in the XY plane of substrate, but makes no mention of the shape of its side faces and means for controlling the shape.

In the above-mentioned conventional methods, the reduction of dimensional accuracy in the surface layer caused by uneven firing shrinkage cannot be avoided when no pressure or a relatively low pressure is applied. A further problem is that ideally the side faces must be in the same flat state as before firing, but actually the uneven shrinkage occurs due to inner wiring or the like, resulting in irregular side faces.

When a large load is applied, the laminate is considerably collapsed during firing, or the laminate reacts with and bonds to the frame used for prevention of the collapse and in either case it is difficult to control the external dimensional accuracy of the sintered body.

SUMMARY OF THE INVENTION

The objects of the present invention are at least to solve these problems, to thereby provide a sintered multi-layer ceramic body improved in the surface dimensional accuracy and simultaneously freely controlled in its side face (external) shape to attain enhancement of external dimensional accuracy and improvement of mechanical reliability and to provide a method for producing the sintered body.

STATES OF THE INVENTION

The above objects have been attained by a sintered body in which the whole or a part of its side face has a curved surface without causing shrinkage in its surface layer by sintering. That is, this is attained not only by controlling pressures applied, but also by controlling to an optimum level the frictional or constraining force between a material which applies a pressure and a material to which the pressure is applied.

The shape of a curved surface includes a concave type and convex type, and either one or both of them can be selected depending on objects or uses.

In the case of the concave type surface, the external (maximum) dimensional accuracy is determined by the surface layer portion and hence both the surface and external dimensional accuracies can easily be ensured merely by controlling the shrinkage of only the surface portion caused by sintering. Moreover, since such side faces have a shape suitable for setting a sample on a device for the production of thin film circuits or for the formation of external electrodes, enhancement of a position-setting accuracy can be attained, registration can easily be performed, handling stability can be improved, and reliability can be increased. A sintered laminate having such a shape can be made by controlling the sintering shrinkage of the surface portion (application of a constraining force) and besides by employing such a means that the shrinkage in the vicinity of a middle layer is not hindered. For example, the simplest method comprises applying to the laminate a load optimized within the range which causes no collapse of the sintered laminate in firing and, besides, optimizing a frictional force between the laminate to which a pressure is applied and a material for applying the pressure to the laminate to a value which provides a constraining force necessary to inhibit the sintering shrinkage of the surface portion of the laminate. More specifically, a material having a rough surface may be used as one which applies the pressure, at the boundary at which the pressure is transmitted to the unfired multi-layer ceramic laminate. That is, the above-mentioned sintered laminate can be realized only by carrying out the sintering with inhibiting the collapse of the laminate under controlling the pressure applied to the laminate as low as possible by increasing the frictional force between the laminate to which a pressure is applied and the material which applies pressure, in other words, by increasing the constraining force in plane.

The sintered laminate of a convex type can be obtained similarly by applying to the outer surface of the laminate a pressure and/or a constraining force within the range of causing no sintering shrinkage of the surface during firing and simultaneously controlling an amount of creep (which is a phenomenon that plastic deformation increases with time even under constant stress) generated in the laminate to compensate for an amount of firing shrinkage of the surface to which the pressure and/or constraining force are not applied (free surface), to thereby control the final external shape, more specifically by curving the whole or a part of the free surface outwardly viewing from the center of the sintered laminate. In this case, the side faces have a roundish shape and so mechanical reliability at handling can be markedly improved.

First, the method of making the side face concave by hindering the shrinkage of the surface will be explained referring to the method of applying a pressure.

Shrinkage of the surface portion caused by firing can be restrained by applying a load of larger than a certain value depending on the thickness of the laminate to be sintered. Since this shrinkage-restraining force (constraining force in a plane direction) is generated by the frictional force exerted between the laminate to which a pressure is applied and a material for applying pressure, the force decreases with increase in the distance from the surface of the laminate. With decrease of this shrinkage-restraining force, the amount of shrinkage inversely increases. Therefore, the side face of the sintered body becomes concave more sharply in the central portion to form a conical shape. A typical shape of such a sintered body is shown in FIG. 1. In this case, the load to be applied has a proper range and, if the load is too small, the surface portion also greatly shrinks during firing and, if it is too large, the sintered body is collapsed and its shape cannot be retained. Preferred shape of the side face may vary depending on the use, but generally it is desired that the curvature radius of the curved portion is at least $\frac{1}{4}$, more preferably at least $\frac{1}{2}$ of the distance between the surfaces to which a pressure is applied (thickness of the sintered body). Furthermore, since the shrinking force in firing somewhat changes depending on the kind of materials of the laminate, density of the laminate and firing conditions, the optimum range of load to be applied must also be changed depending thereon.

Next, the method for making convex the whole or a part of the side face of the laminate by generating a proper amount of creep will be explained. For this method, firstly the pressure applied so as not to generate any firing shrinkage in the outer surface can simultaneously be utilized. Since the surface shrinkage restraining force generated by the pressure applied is generated by the frictional force exerted between the laminate to which a pressure is applied and the material for applying the pressure, the shrinkage-restraining force can be increased with increase of the applied pressure, FIG. 2 shows a general relation between the applied pressure and dimensional change by firing (in XY direction of the surface to which a pressure is applied) when the laminate was fired under pressure on the two opposite surfaces. The dimensional changes are shown by the position of a pattern formed on the surface to which a pressure is applied and the rate of the outermost dimensional change in XY direction of the sintered body. With increase of the applied pressure from zero (0) both the rate of dimensional change of the surface pattern and the rate of the outermost dimensional change decrease in the absolute value in their negative value and both reach zero (0) at a certain applied pressure. In this range (shown by A in FIG. 2), the free surface of the sintered body is larger in sintering shrinkage than the constrained surface and, hence, the shape of the free surface generally becomes concave. Therefore, the outermost dimension in XY direction of the sintered body is determined by the dimension of the surface portion to which a pressure is applied. When the pressure applied is further increased (shown by B in FIG. 2), the rate of change in the outermost dimension changes from shrinkage to expansion and increases with increase in the applied pressure. This state indicates that change occurs due to a creep larger than the firing shrinkage of the free surface of the sintered body and the free surface is in a convexly and outwardly curved shape. Such state has not been utilized for production of the sintered ceramic body because of collapse of the sintered body and for the use which requires especially high accuracy. However, the inventors have found that even under such a high pressure applied, if the frictional force exerted between the laminate to which a pressure is applied and the material for applying the pressure is optimized, the rate of dimensional change of the surface pattern can be kept at zero (0) under a certain range of applied pressure. In other words, a sintered body superior in surface dimensional accuracy and having the side face of a convex shape which is good in reliability can be obtained by selecting the range of the applied pressure which exceeds the minimum pressure at which the surface dimensional change becomes zero (0). The typical shape thereof is shown in FIG. 3. However, if the pressure applied is too high, the sintered body is considerably collapsed and the shape and position of a conductor wiring formed inside the sintered body change to such a degree as unsuitable for practical use and, besides, the shape of the sintered body per se cannot be retained. In general, the range of the pressure applied necessary so as not to bring about the sintering shrinkage of the outer surface not necessarily agree with the range of the pressure applied necessary to produce a proper amount of creep in the free surface. Therefore, in order to meet these conditions, it is necessary and indispensable to optimize the above-mentioned frictional force exerted between the laminate to which a pressure is applied and the material for applying the pressure. By devising in such a way, the range of a pressure necessary so as not to generate sintering shrinkage in the outer surface can be varied, and hence it has become possible for the first time to find the range of the pressure which does not generate sintering shrinkage on the outer surface and can generate a proper amount of creep on the free surface. FIG. 4 shows a general relation between the applied pressure and the rate of dimensional change by firing (XY direction of the surface to which a pressure is applied) when the frictional force exerted between the laminate to which a pressure is applied and the material for applying the pressure is changed. In general, the necessary pressure applied increases with increase in the thickness of the laminate sintered. Such condition as applied pressure varies depending on the kind of material, thickness and density of the laminate and firing conditions, but generally, the optimum pressure can be selected in a wider range when the frictional force is increased and thus a process margin can be increased.

FIG. 5 is a sectional view of the central portion of a sample obtained by sintering a laminate, to the upper and lower surfaces of which are applied alumina/silica porous sheets of 60–70% in porosity with changing the pressure applied (the upper and lower surfaces are constrained faces). FIG. 5a shows an example of a lower applied pressure in which the side face is concavely curved toward the center of the sample plate. Degree of this curving is greater with being close to the center of the sample plate (see FIG. 1a and FIG. 1c). Further, when as conditions for shrinkage of the surface being made zero (0), the applied pressure and the surface frictional force or shrinkage constraining force are controlled to optimum together with the sintering conditions and conditions for setting the material, the curved shape of the side face has a low curving degree in the vicinity of the surface (large in curvature radius) and has a large curving width at the position somewhat remote from the surface (in thickness direction) as shown in FIG. 5a. When the curving degree of the side face is expressed by distance (width) $x_1$ shown in FIG. 5a, $x_1$ is preferably ⅛ or less, more preferably 1/6 or less of the thickness of sample.

When only the pressure applied is increased than that in FIG. 5a, the central section of the sample specifically changes in its shape as shown in FIG. 5b and FIG. 5c in this order.

FIG. 5c shows a shape obtained by optimally controlling the deformation caused by creep together with the surface constraining force and the side face wholly curves outwardly in a convex form. When the maximum curved width is referred to as $x_2$, $x_2$ is preferably ⅛ or less, more preferably 1/6 or less of thickness of the sample. The shape shown in FIG. 5b is one attained when the applied pressure is medium between those in FIG. 5a and FIG. 5c and the side face in the vicinity of the surface is in a convex form and the central section of the side face is in a concave form. The maximum curved distance in this case is preferably ⅛ or less, more preferably ⅙ or less of the thickness of the sample.

When the method of the present invention is employed, the side face has never been in a flat form under any pressures applied.

Next, in a second method for generating a proper amount of material creep on a free surface, firing conditions (temperature and time) for generating the optimum creep can be chosen under application of only the surface constraining force to a part of the outer surface so as not to bring about sintering shrinkage. The constraining force is a force generated in the direction parallel to the face to which the force is applied, and the force can be imparted by a vacuum or reduced pressure chuck or by bonding the sample to a dimensionally stable substrate. Furthermore, it can be imparted together with application of pressure. In this case, the condition of the surface constraining force can be such that the surface dimensional stability can be ensured even under the selected optimum creep condition. However, in the range of the present invention where a proper amount of creep occurs, it is preferred to apply a constraining force larger than the constraining force which can reduce the surface shrinkage to zero (0) in the range where the shape of the side face is kept in a concave form. From the point of process margin, it is also preferred to apply a somewhat larger constraining force. In this case, too, the condition for the optimum constraining force varies depending on the kind of materials, thickness and density of the laminate and the firing conditions. FIG. 6 shows some reduced pressure chuck methods. In these examples, the reduced pressure chuck device portion is fitted to or set in a cylinder capable of precisely controlling the position and pressure so that the pressure applied to the laminate in the direction of the thickness of the sample can be controlled. Use of such device has the merits that the thickness of the sintered body can be precisely determined by control of the cylinder.

Further, when it is desired to control the sintered body to be porous, it also becomes possible to control the amount of firing shrinkage in the thickness direction to a lower level (to restrain the shrinkage in thickness direction) by this device. The range of the surface constraining force is generally 100 g/cm$^2$ or more, more preferably 500 g/cm$^2$ or more and this is the larger the better. The range of the static coefficient of friction is generally 0.6 or higher, more preferably 0.8 or higher. However, these ranges vary depending on the firing conditions and construction of the materials and should not be limited to the above-mentioned ranges.

The range in which the sintering shrinkage of the surface to which the pressure and/or constraining force are applied does not occur or the range in which the dimensional change can be regarded to be substantially zero (0) can be considered to be within ±0.5%, preferably within ±0.3% as a rate of change in dimension as compared with the dimension before sintering. Especially when severe dimensional accuracy is required, the range must be within ±0.1% in some case. The surface of the compact body or laminate to which the pressure and/or constraining force are applied is preferably one which has the largest area among a plurality of the surfaces of the compact body or laminate. In other words, the thickness is preferably smaller than the maximum length of the surface of the laminate, namely, smaller than the length of diagonal line of the surface in the case of a rectangular parallelepiped. A sintered body having a free surface, the whole or a part of which is outwardly curved in the form of convex from the center of the sintered body is markedly improved in mechanical reliability when subjected to post-step operations such as, plating, attaching of pins and formation of thin film layers on the resulting sintered body, because angles formed by crossing of the two faces which own jointly an edge are obtuse. Preferably the free surface which differs depending on use has generally such a shape that the average curvature radius of the curving portion is preferably at least ¼, more preferably at least ½ of the distance between the opposite sides of the free surface.

The pressure is preferably always applied perpendicularly to the surfaces of the multi-layer ceramic laminate during firing and it is preferred to apply the pressure by placing on the laminate a load provided with such a structure that the pressure can be always applied perpendicularly. For example, a piston-like structure or a jig provided at the periphery thereof with a plurality of pins is effective, which limits the direction of moving of the load (inhibition of lateral deviation and deflected pressure) when the load moves in the thickness direction with shrinking of the laminate in its thickness direction during firing.

The material which directly contacts the laminate is preferably high in dimensional stability up to the firing temperature of the laminate and rough in its surface. That is, when the frictional force between the surface of the material and the laminate is large, the firing shrinkage of the laminate can be restrained by a smaller load and so influence of collapse caused by application of pressure can be inhibited and thus the firing can be easily performed. The range of the surface roughness (Ra) in this case varies depending on the kind of laminates and use of the sintered body, but is generally at least 1 μm, preferably at least 2 μm for effective control of shrinkage caused by firing. Furthermore, a porous material is effective as the material which applies pressure. In this case, the average pore size is generally 0.5 μm or more, preferably 1 μm or more.

The frictional forces/constraining forces exerted on the upper and lower surfaces of the laminate to be sintered under application of pressure are not necessarily identical. If it is not identical on the upper surface and the lower surface, since the shrinkage of the surface to which a smaller frictional force/constraining force is applied is greater and thus the areas of the upper and lower surfaces differ, the side face can be made into a curved shape which is unsymmetrical in the thickness direction, but there is no problem if the surface which requires high dimensional accuracy is restrained from firing shrinkage. An example of the sectional shape of such sintered body is shown in FIGS. 7a, b and c.

If the material which applies pressure remains on the surface to which the pressure and/or constraining force is applied after firing, this can also be removed by such means as grinding, blasting, and chemical treatment. Furthermore, if the whole or a part of the side face must be finally flat, the side face can be naturally processed by cutting, grinding and the like. In this case, the merit in processing costs is greater than when the pressureless sintering method or hot press sintering method is employed, because the portion of the side face to be ground can be made small.

In the case of multi-layer ceramic sintered bodies in which through-holes or via holes must be formed, when they are fired by a conventional pressureless sintering method, there are problems that debonding or cracking occurs around the through-holes or via holes and uneven irregularities are formed in the substrate surface portions of the through-holes or via holes unless firing shrinkage characteristics such as a firing shrinkage ratio and an amount of the shrinkage of a ceramic portion and conductor paste accurately meet with each other. According to the method of the present invention, the shrinkage in the thickness direction is greater in correspondence to a smaller shrinkage in the plane direction and so, the material transfer of the ceramic portion is relatively easy. Therefore, a difference in the firing shrinkage ratio or amount of shrinkage can be sufficiently absorbed during the stage of firing. Thus, strict agreement of the firing shrinkage characteristics of ceramic portion and conductor paste as required in the conventional methods is not needed in the present method. Moreover, another severe problem such as debonding and cracking which occur due to the change in volume resulting from oxidation or reduction of wiring materials in such methods as using metal oxides (such as CuO and $Cu_2O$) as conductor-forming materials and reducing them to a metallic conductor during the processing for carrying out the binder burn-out process in air. These problems also can easily be solved by the present method. Furthermore, according to the present invention, such feature is obtained that the central line of through-hole or via hole is curved along the curved shape of the side face of a sintered body in the thickness direction especially in the vicinity of the substrate. This is schematically shown in FIG. 8a and 8b where the through-holes were formed through the whole of the sintered body.

In the method of the present invention there is no need to use a frame for constraining the side faces of laminates in firing under application of pressure and the side faces are free and so, removal of organic materials contained in the laminates (binder burn-out) is easier than in the usual hot press method. Moreover, when a relatively large amount of organic materials are contained in the multi-layer ceramic laminate, dimensionally stable and porous sheet-like materials are placed on the upper and lower surfaces of the laminate and the laminate is sintered under application of pressure through these sheet-like materials, whereby heat-decomposition products and burned products of the organic materials can easily be discharged from also the upper and lower surfaces and thus the method is effective for removal of organic materials (binder burn-out). The porosity of the porous material used in this case is in such a range that the material can keep a strength higher than the applied pressure and is preferably as high as possible and suitably 30-90%. Especially, a porous sheet which is a composite of heat resistant ceramic fiber materials is an effective material since it can be inhibited from reduction of the strength and open porosity can be increased. In addition, nonwoven fabrics made of heat resistant fibers such as ceramic fibers (e.g. ceramic paper) and woven fabrics (e.g. glass cloth and alumina cloth) are effective. Furthermore, the simultaneous addition of a catalyst for acceleration of the binder burn-out to the laminate or the porous materials through which pressure is applied is effective for improvement of the binder burn-out. Still further, firing under no pressure in a range of up to the temperature at which the sintering shrinkage of the laminate not yet occurs and before completion of the heating step for the binder burn-out and thereafter sintering of the ceramic portion under pressure, is effective. In this case, a dimensional change occurring in the heating step for the binder burn-out must be controlled to obtain the desired dimensional accuracy of the final sintered body. Especially when the rate of the dimensional change should be substantially zero (0), it is necessary that the heating step for the binder burn-out must be carried out in a temperature range where the dimensional change due to sintering does not occur. When a glass material is contained in the insulator layer of a molded body or laminate, the heating step is preferably carried out at a temperature lower than the softening point of the glass material (the temperature at which the viscosity is $4.5 \times 10^7$ poises), more preferably lower than the point of incipient deformation (the temperature at which the viscosity is $10^{11}$ poises).

Firing of a compact multi-layer ceramic body or laminate can be carried out in an oxidizing atmosphere, inert atmosphere, reducing atmosphere or under vacuum, or in combination thereof. When a low oxidation resistant conductor material is used, the method preferably includes a firing step in humidified atmospheric gases such as $Ar/H_2O$, $N_2/H_2O$ and $N_2/H_2/H_2O$ for the binder burn-out. Furthermore, if necessary, firing in an atmosphere of a gas pressure higher than atmospheric pressure is also preferred for densifying of the sintered body or acceleration of the binder burn-out.

No need to use any frame has additional merits of reduction of production costs and shortening of time. Furthermore, there is another merit that a method can be used according to which a plurality of multi-layer ceramic laminates, each of which is sandwiched between sheets having rough surfaces of porous sheets, are stacked and these laminates are fired together by applying a pressure onto the uppermost surface and the lowermost surface thereof, or a method of using a furnace provided therein many piston type pressurizing apparatuses (multihead piston) can be used. These methods are further effective for improvement of mass-productivity and reduction of production costs.

The surface condition of a material which directly contacts the sintered body is transferred to the surface of the sintered body obtained by the method of the present invention. Therefore, the surface roughness of the sintered body produced can be controlled by employing a material having a controlled surface roughness for applying a pressure therethrough, whereby it is also possible to improve the bond strength between the sintered body and a thin film which is formed at a later step. However, if the surface of the material through which a pressure and/or constraining force is applied is too rough, resulting in too large irregulatirites of the surface of the sintered body, there may occur such problems that the surface of the thin film formed at later step is affected by the irregularites of the substrate and failure in bonding occurs in attaching parts such as semiconductor chips on the surface of substrate to cause reduction of the yield. Therefore, the surface roughness of the material through which a pressure and/or constraining force is applied is 50 μm or less, preferably 20 μm or less in use for ordinary electronic materials. When a porous material is used, the pore size thereof is generally 50 μm or less, preferably 20 μm or less. When the surface is required to be smooth, the surface can be processed by grinding and other methods after completion of sintering. In this case, too, the sintered body obtained by the method of the present invention has little warpage as a whole and, hence, there is the merit that the amount of the portion to be ground can be small.

When very high dimensional accuracy is required for the sintered body, the material through which a pressure is applied and which directly contacts the laminate is required to have a thermal expansion coefficient close to that of the sintered body. On the other hand, when requirement for dimensional accuracy is somewhat gentle, a sintered body having a residual compression stress on its surface can be produced by employing a material having a thermal expansion coefficient higher than that of the sintered body as the material for application of pressure, whereby the strength of the sintered body can also be improved.

According to the method of the present invention, it is also possible to produce with high accuracy a sintered multi-layer ceramic body in which the ceramic insulating layer of a compact body or laminate having a ceramic insulating layer and a conductor layer is composed of a combination of different kinds of ceramic materials. In such case, according to the conventional methods, warpage and peeling readily occur in sintered bodies due to differences in firing shrinkage characteristics and thermal expansion coefficient between different ceramics and, besides, the control of dimensional accuracy becomes more and more difficult. In fact, it has been nearly impossible to produce a multi-layer ceramic sintered body with combinations of various ceramics. However, according to the method of the present invention, substantially no firing shrinkage of compact body occurs and, thus, the above problems have been solved and a superior sintered multi-layer ceramic body can be produced. For example, when a multi-layer substrate for electronic device packaging suitable for diminishing various noises is to be provided, the present method is also effective for making the substrate with a capacitor built therein by forming a layer comprising a material having a high dielectric constant inside or on the surface of a multi-layer ceramic laminate composed of a material having a low dielectric constant and simultaneously firing them. In this case, as the capacitor, materials having a high relative dielectric constant such as those of barium titanate and lead titanate types are preferably used, and especially when it is used in a high frequency area, it is preferred to use microwave dielectrics, which are somewhat low in relative dielectric constant but good in high frequency characteristics, of, for example, a $(Mg—Ca)TiO_3$ composite perovskite type, $BaO—TiO_2$ type, $BaO—TiO_2—WO_3$ type and $(Ba—Sr)O—Sm_2O_3—TiO_2$ type which have a relative dielectric constant of about 20–200. Moreover, according to the method of the present invention in which a pressure is applied, the total thickness of the laminate and the thickness of the insulator in each layer can be made smaller as compared with those in normal pressureless firing methods, since the rate of firing shrinkage in the thickness direction of the laminate is particularly larger than that in the pressureless firing. For example, when a thin multi-layer substrate is desired to be produced by a green sheet method, the thickness of one green sheet layer can be reduced but, in this case, there is such a problem that the handling property and dimensional stability of the sheet during the process are deteriorated. On the other hand, according to the present method, the thickness can be made thinner than that of the final sintered body using the conventional sheet. Furthermore, especially when the above-mentioned substrates with capacitors built therein or multi-layered capacitor chips are produced, there is such a merit that the thickness per one layer is thin and hence products of a high capacity can be obtained. Substrates provided with a capacitor can also be produced by attaching a small chip capacitor onto a fired substrate or by forming a thin film capacitor using a thin film process and, in this case, too, the substrate fired by the present method which can ensure a high surface dimensional accuracy is suitable. Moreover, it is also possible to obtain an integrated laminated compact body or laminate in which only the insulator layer near the surface among a plurality of layers which constitute the compact body or laminate is composed of a material different from other insulator layers. According to this method, it is possible to strengthen the surface layer which is exposed to the thermally and mechanically severest environment. Further, in carrying out the above-mentioned heating step for the binder burn-out without applying a pressure and/or constraining force, it is also an effective means to raise the softening temperature of a glass component contained in the outer insulator layer so as not to cause the dimensional change of the surface portion. Besides, if a material which is substantially not sintered at the firing temperature of the compact body and/or laminate is used as the outer insulator layer material, reaction with material which applies pressure and/or constraining force can be inhibited and furthermore, the material can easily be removed after firing.

Moreover, in an application of the present method, some of ceramic insulating layers which constitute an integrated or laminated compact body or a laminate comprising the ceramic insulating layers and conductor layers may be a substrate which has been fired. This fired substrate may be used as an outermost layer or an inner layer of the compact body or laminate or as both of them. Alternatively, it may be provided on both the upper and lower faces or either one of them. When it is provided on the surface, it is especially preferred to use a fired substrate which is dimensionally stable at the firing temperature of the laminate. In addition to the method of firing an integrally molded laminate and fired substrate under pressure and/or constraining force, a method can also be used which comprises laminating an unfired laminate and a fired substrate and integrating them at the time of firing. When such method is employed, it is necessary to optimize the frictional force at the boundary between the fired substrate and the other unfired portion which constitutes the compact body or laminate. For this purpose, the roughness of the surface of the fired substrate which contacts the unfired laminate portion may be optimized. The optimum surface roughness of the fired substrate varies depending on the kind of material, density and shape of the laminate and firing conditions, but the surface roughness (Ra) is preferably at least 0.5 $\mu$m, more preferably at least 1 $\mu$m. When the fired substrate is provided as an outermost layer, the area of the fired substrate to be laminated is especially preferably more than that of the unfired portion of the laminate. In this case, for example, if the side face of the laminate portion is optimized to form a concave in sintering, the dimensional stability of the surface and external shape of the final sintered body is necessarily determined by the dimension of the surface fired substrate. In the case where the fired substrate integrated with the surface is larger than the laminate portion, the external dimension of the composite sintered body is also determined by the dimension of the surface fired substrate even when the side face of the laminate is fired into a convex form by increasing the pressure applied, if the condition at which the dimension of this convex form does not exceed that of the surface fired substrate, namely, the condition at which there is still a concave in the side face, seeing from the whole of the sintered laminate body. Therefore, if the fired substrate is previously processed to attain the high accuracy of the external dimension, this high dimensional accuracy can easily be ensured. Some examples of the sectional shape of sintered composite bodies obtained by these methods are shown in FIG. 9. In this arrangement, the external surface of the laminate, namely, the face which does not contact the unfired portion of the laminate can be made smooth by grinding and the like and hence this is especially effective when thin films must be formed in the later stage. Moreover, when this method is applied to a multi-layer wiring circuit substrate, a method is effective in which a fired substrate having wirings formed between the surface and back sides (via) and/or on the surface and back sides is registered with an unfired multi-layer ceramic laminate portion in which the similar wirings are formed so that the wirings are connected with each other, followed by integral compacting and firing. In this case, the wirings between the surface and back sides and/or on the surface and back sides of the fired substrate may be those which have previously been fired or the wirings may be unfired which are formed between the surface and back sides (via) and/or on the surface and back sides using a conductor paste in a fired substrate having a plurality of through-holes. Furthermore, a method may be used which forms a wiring between the surface and back sides (via) by embedding conductor blocks in a plurality of through-holes formed in the fired substrate. A method in which a plurality of through-holes formed in the fired substrate are formed by mechanical processing, laser processing, electron-beam processing, chemical treatment and the like after the firing of the substrate, is especially suitable for forming the through-holes with a high positional accuracy. In the case of the above fired substrate previously provided with fired wirings or conductor blocks, it is also effective to employ different materials for conductors formed in the fired substrate and for conductors formed in the unfired portion of the compact body or laminate other than the fired substrate. Moreover, the following method is also effective for the uses mentioned below. That is, in the method, a plurality of through-holes are previously formed in the fired substrate to be integrated with or laminated on the outermost layer of the compact body or laminate and, if necessary, a wiring is formed using a conductor paste on the surface of the fired substrate and is registered with the conductor portion formed in the unfired portion of the compact body or laminate other than the fired substrate. They are laminated and thereafter fired together to form a plurality of dimples on the surface. A conductor portion is positioned in the bottom of a plurality of the dimples formed on the surface of the sintered body and a conductor bonding material such as a solder or conductor ball or conductor pin is charged or inserted in the dimples to form a connection with the conductor portion in the bottom of the dimples. There are such merits that spreading of the solder can be limited to the dimples, the height of the solder can be increased, and the bond strength of the pin can be improved. Furthermore, if a fired substrate having a high strength is used, the strength of the fired substrate portion can easily be enhanced over other insulator portions and, thus, the strength of the whole sintered body can be increased. Especially, if the fired substrate is provided on the outermost layer of the multi-layer sintered body, the effect is high. It is also possible to employ a material containing many voids, generally low strength material for the internal layer portion by ensuring the strength of the substrate by the fired substrate portion provided on the surface by the above-mentioned method. According to this method, since the relative dielectric constant of the internal layer portion can be much reduced, this method is suitable for the use such as multi-layer circuit substrates which especially require high-speed signal transmission. In order to increase voids in the internal layer portion, hollow particles such as silica beads and alumina beads can be used as a part of ceramic raw materials used, in addition to choosing a material composition inferior in sinterability. If the side face containing many voids of the sintered body is exposed and if especially high reliability is required, the surface may be coated with a low-melting point glass or metallic material or organic material at the later step. In this case, the side face is especially preferably in a concave form. Further, it is also possible to improve the thermal conductivity of the sintered multi-layer ceramic body by using a fire substrate comprising a material having a high thermal conductivity. A substrate comprising silicon carbide, aluminum nitride, boron nitride, diamond or the like is suitable as the substrate having a high thermal conductivity. In many cases, this method is preferred since the area of the laminated face of the fired substrate can be identical or larger than that of the laminated faces of the other unfired portions constituting the compact body or laminate. When a plurality of substrate portions having a high conductivity which is exposed and/or projected from the sintered multi-layer ceramic body are connected to each other by a material having a high thermal conductivity such as a metal at the later step, the whole of the sintered body can be substantially made highly thermally conductive. A part of the exposed and/or projected substrates having a high thermal conductivity is further thermally conducively connected to an external heat sink or the like and heat can be forcedly dissipated therethrough. This method is especially effective for uses such as a multi-layer ceramic circuit substrate comprising a substrate of high thermal conductivity on which a plurality of LSI chips having a large heat release value are provided.

When the fired substrate is positioned as the internal layer portion and when the fired substrate should be completely embedded inside the sintered body from the standpoint of necessity to provide the fired substrate and assurance of reliability, it is preferred that the area of the laminated face of the fired substrate is smaller than that of the laminated face of the other unfired portion constituting the compact body or laminate. As mentioned above, when the fired substrate is provided inside the sintered body, since a force to suppress the whole sintering shrinkage has already been imparted onto the surface of the multi-layer ceramic laminate, it is not necessary to control the frictional force of the surface by especially increasing the surface roughness of the fired substrate. For the above-mentioned fired substrate of a built-in structure, functional parts such as a capacitor are effective and, besides, it is naturally possible to contain many small parts such as chip capacitors, resistors and coils.

Materials of conductor layers formed on the surface or in the sintered ceramic body include suitably Cu, Ag, Au, Ag/Pd, Ni, W, Mo, Pd, Pt and mixtures thereof. The conductor materials used in combination as above may be used in the form of alloys or those which are printed and then reacted during firing to form alloys as at least a part. Alternatively, they may be those which do not react with each other even after firing and exist as a composite material in an integral form. Thus, the firing atmosphere, thermal expansion coefficient and electric conductivity (resistivity) can be widely chosen for conductor materials. Moreover, a plurality of conductor layers which constitute the compact body or laminate can be formed of different materials. Especially when the insulator compositions of the laminate are different, it is preferred to select a combination of conductor materials optimum for respective insulators.

When the sintered body produced is a multi-layered capacitor and it is necessary to form a conductive portion (external electrode) on the side face of the sintered body, the external dimension may not be increased if the side face is concavely formed and filled with a conductive material at the concave thereof. The reliability of the thus formed conductive portion is improved.

As ceramic insulating materials, there may be used various ceramics such as those which are mainly composed of alumina, mullite, zirconia, aluminum nitride, boron nitride, or mixtures thereof, various glasses such as borosilicate glass and aluminosilicate glass, glass ceramics containing crystals such as cordierite and $\beta$-encryptite, and composite materials of these with ceramics fillers such as alumina, silica, mullite, zirconia, magnesia, silicon carbide, silicon nitride, aluminum nitride, boron nitride, and diamond, and materials suitable for capacitors and piezoelectric devices which are mainly composed of composite perovskite compounds such as barium titanate and lead titanate and others containing lead. Especially, ceramic materials which form a liquid phase upon sintering is suitable.

According to the present invention, there is obtained a sintered body which undergoes no firing shrinkage of the surface layer and has the side face in a concave or convex form and a laminate ceramic sintered body superior in both the surface dimensional accuracy and external dimensional accuracy or a sintered body superior in mechanical reliability can be relatively simply realized. Especially, for the use as LSI packaging substrate, remarkable improvement of the dimensional accuracy can be attained through all steps, since the dimensional accuracy of the surface on which chips are provided is very high and all of the registrations at later steps can be conducted on the basis of this surface. Moreover, the sintered multi-layer ceramic body obtained by the present invention can be widely used for multi-layer ceramic parts for various electronic equipments, multi-layer wiring substrates for LSI packaging of electronic computers, highly functional structural materials.

BRIEF DESCRIPTION OF THE DRAWINGS

FIG. 2 is a graph which shows a general relation between an applied pressure and a rate of firing dimensional change (the surface to which a pressure is applied: XY directions) when firing is carried out under pressure onto the two opposite surfaces.

1—sintered multi-layer ceramic body, 2—curved side face of sintered multi-layer ceramic body, 3—through-hole, 4—fired substrate, 5—multi-layer ceramic capacitor, 6—internal electrode, 7—concaved side face of multi-layer ceramic capacitor, 8—external electrode, 11—multi-layer ceramic, 12—non-sinterable green sheet, 13—internal wiring, 14 and 15—terminal pads, 16—via wiring, 17—void, 18—solder, 19—hollow beads, 20—a portion of internal via wiring, 21—insert type I/O pin, 22—small hole (dimple), 23 and 24—solder for filling and bonding, 25—polyimide/Cu thin film multi-layer wiring portion, 26—solder ball, 27—carrier substrate, 28—LSI chip, 29—cap, 30—internal via wiring, 31—internal wiring, 32—I/O pin, 33—multi-layer ceramic capacitor, 34—internal wiring of multi-layer ceramic capacitor, 35—through-hole of multi-layer ceramic capacitor, 100—heat resistant porous plate, 101—multi-layer ceramic compact body, 102—reduced pressure chuck device, 103—suctorial mouth, 104—pressure compensating mechanism (cylinder), 105—stage, 106—glass/sintered ceramic composite body, 111—AlN substrate, 112—hollow beads, 113—solder, 114—LSI chips, 115—solder ball, 116—I/0 pin, 117—via hole, through-hole, 118—internal wiring, 119—multi-layer ceramic capacitor, 120—internal electrode of multi-layer ceramic capacitor, 121—through-hole of multi-layer ceramic capacitor.

The following nonlimiting examples will further illustrate the present invention.

EXAMPLE 1

75 vol % of a borosilicate glass powder having an average particle size of 2 μm and comprising, in terms of oxide, 65–85% by weight of $SiO_2$, 10–30% by weight of $B_2O_3$, 1–10% by weight of $Al_2O_3$, up to 10% by weight of an alkali metal oxide and up to 1% by weight of others and 25 vol % of an alumina powder having an average particle size of 1 μm were mixed and thereto were further added a methacrylic resin binder, a plasticizer and a solvent. Then, they were wet ball milled for 24 hours to prepare a slurry. Green sheets were prepared with this slurry by a doctor blade method. Holes of 100–150 μm in diameter were made through these green sheets by a punching method and filled with a conductor paste of Cu to form via-wirings. A wiring was printed using the Cu paste also on the green sheets. Fifty (50) of these green sheets printed with various wiring circuits were stacked and laminated by applying a pressure and heat under the conditions of 100° C. and 100 kg/cm² to obtain a multi-layer ceramic laminate in which a wiring was three-dimensionally formed. The thickness of the resulting laminated compact body was about 14 mm.

This compact body was sandwiched between alumina porous plates (porosity: about 70%, average pore size: 10 μm) and fired in a non-oxidizing atmosphere at 950°

C. for 1 hour under a pressure of 0-2400 g/cm² onto the upper and lower surfaces. Binder burn-out was sufficiently effected under heating at a low rate of 100° C./hr or less from room temperature to about 600° C.

Figure 10:
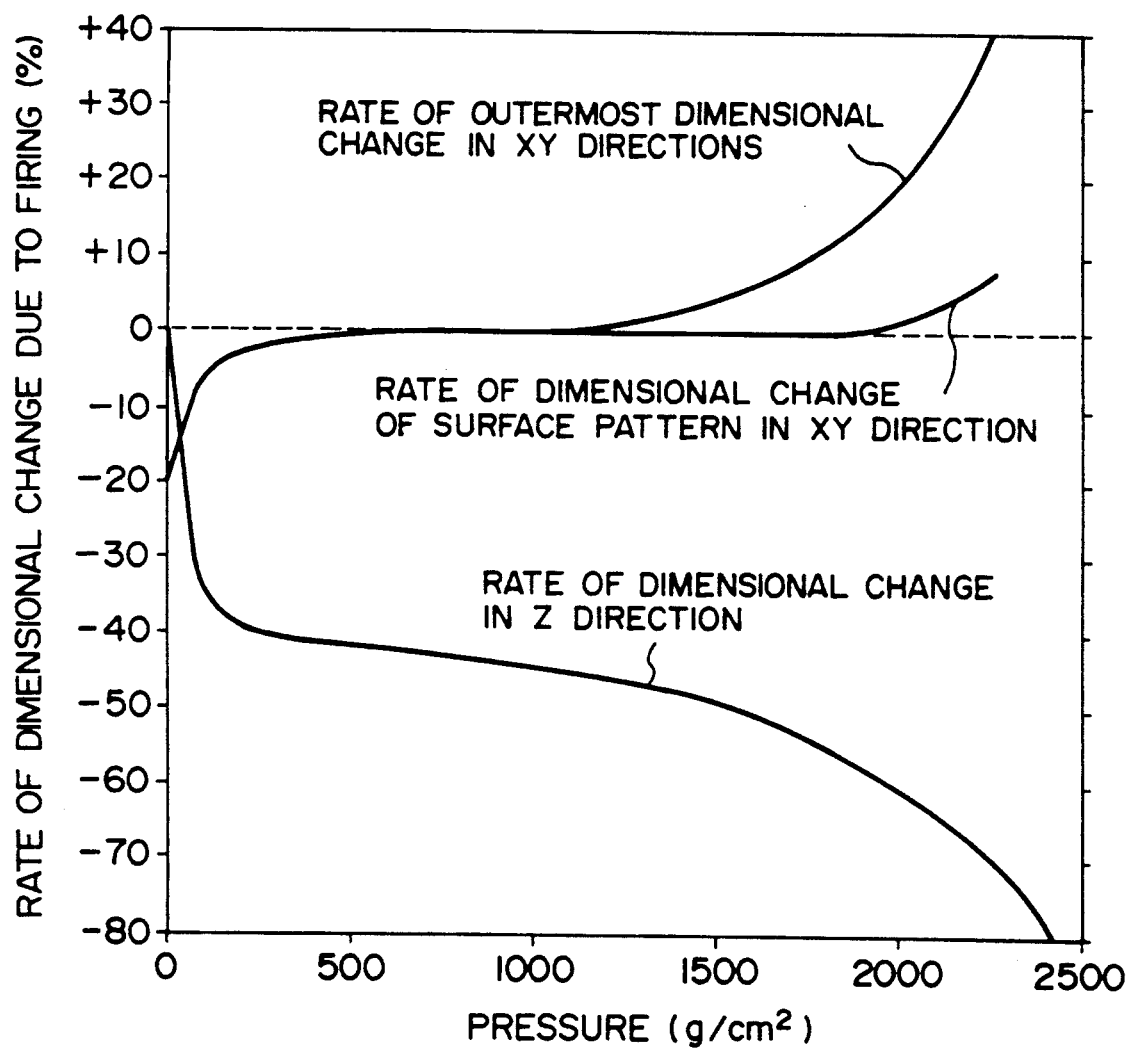
FIG. 10 is a graph which shows a relation between an applied pressure and a rate of firing dimensional change in the pressure-applied direction and in the direction perpendicular thereto.

Relations between the applied pressure and the rates of dimensional change caused by firing in the pressure applied surface, namely, in XY directions and Z direction are shown in FIG. 10. As the dimensional change in XY directions, the rate of positional change of pattern formed on the surface to which a pressure was applied and the rate of the outermost dimensional change of the sintered body are shown, respectively. It was seen that the average rate of the dimensional change in X,Y directions of the surface layer of the sintered multi-layer ceramic body to which a pressure was applied, became zero (0) when a pressure of about 1100 g/cm² was applied. Furthermore, a shrinkage in Z direction in this case was about 45%. However, under such pressure applied, since a shrinkage caused by sintering of the surface of the sintered body to which the pressure was not applied, was larger than the amount of creep, the shape was slightly concave. With further increase of the pressure applied, the rate of outermost dimensional change varies from shrinkage to expansion. First, at the point when the applied pressure was slightly increased, only the portion of free surface in the vicinity of the pressure applied surface became convex. With further increase in the pressure, the whole free surface was curved outwardly in the form of convex. Besides, the rate of dimensional change of the surface pattern could be kept at zero (0) even under a pressure within the range in which at least a part of this free surface became convex. However, when the pressure applied exceeded about 2000 g/cm², the sintered body was considerably collapsed (at least 60% in shrinkage in Z direction) and the shape and position of a conductor wiring formed inside the sintered body changed to such an extent to cause practical problems. In this example, the range of pressure applied which resulted in a curving degree in the form of convex of the free surface which was at least ¼ of the thickness of the sample in terms of an average curvature radius was 1200-2000 g/cm² Moreover, the range of pressure which resulted in the concave shape of the whole or at least a part of the side face and the rate of dimensional change of surface pattern of 0.5% or less was 600-1200 g/cm².

Figure 11:
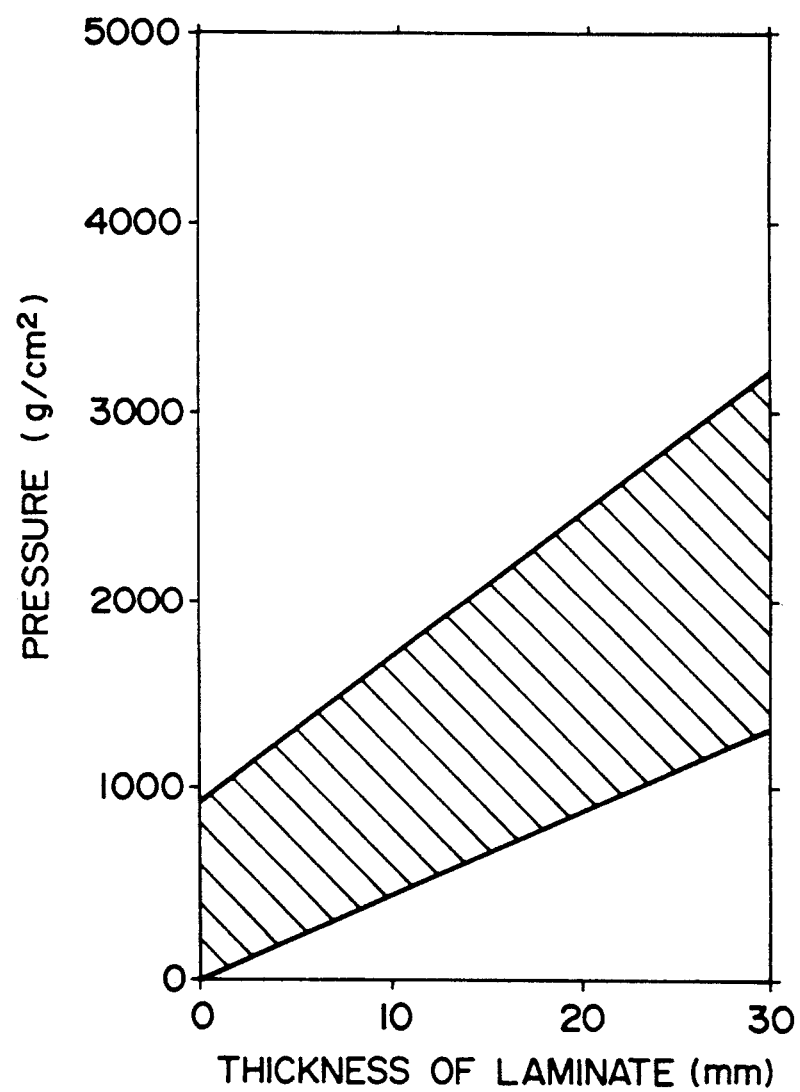
FIG. 11 shows, in relation with the thickness of laminate, an optimum range of an applied pressure for an average shrinkage in XY directions due to the sintering being made substantially zero (0) and for maintaining the shape of the side faces in an optimum range.

Next, laminated compact bodies having different thicknesses were prepared by changing the number of green sheets to be stacked and laminated, and the shrinkages when fired and the shape of sintered bodies under various pressures applied were examined. The oblique line portion in FIG. 11 shows, in relation with the thickness of the laminate, the range of an applied pressure optimum for an average shrinkage in X,Y directions due to sintering being able to be made substantially zero (0) and for the side face being able to be outwardly curved in the form of concave or convex. The range of an optimum pressure applied could be relatively widely ensured and it could be confirmed that this method is very effective in process control.

In this example, when the samples were fired under a pressure of higher than 1000 g/cm², a part of the alumina porous plate sometimes remained on the surface of the samples. However, in such case, the remaining porous plate could be removed without damaging the surface pattern by subjecting the surface of the samples to abrasion or blasting treatment.

EXAMPLE 2

Figure 1A:
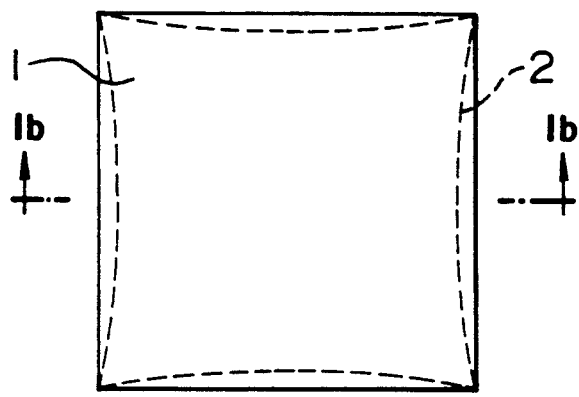
FIG. 1a is a top view of a sintered body, the side faces of which are in the form of concave in the thickness direction thereof.
Figure 1B:
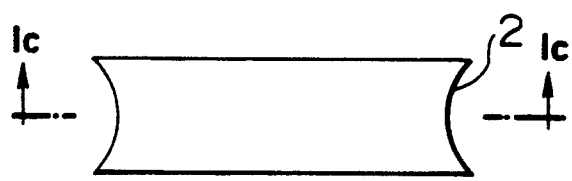
FIG. 1b is a sectional view of the sintered body of FIG. 1a taken along the line X—X'.
Figure 1C:
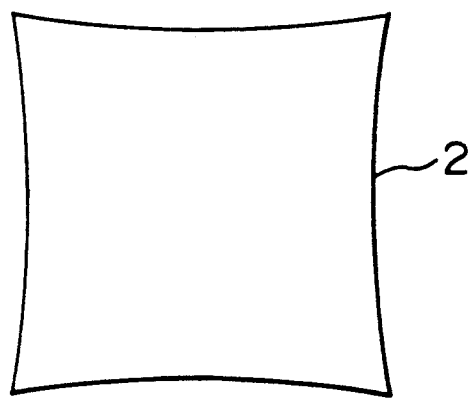
FIG. 1c is a top sectional view of the sintered body of FIG. 1b taken along the line Y—Y'.
Figure 3A:
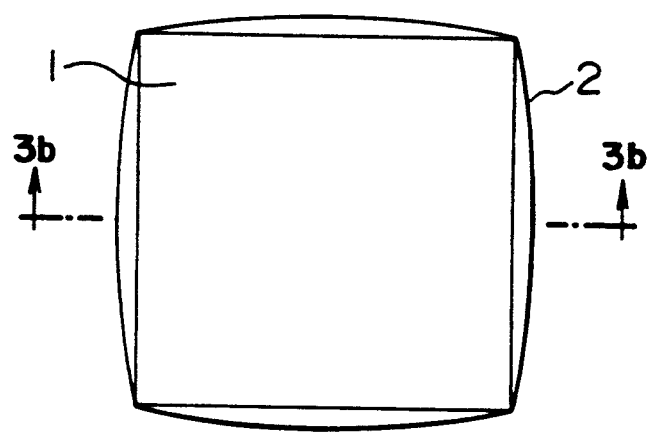
FIG. 3a is a top view of a sintered body, the side faces of which are in the form of convex in the thickness direction thereof.
Figure 3B:
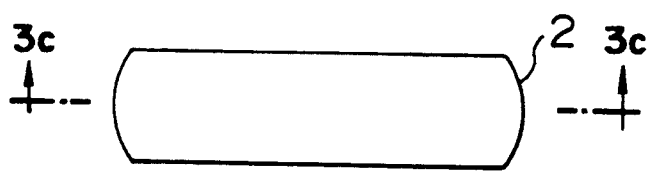
FIG. 3b is a sectional view of the sintered body of FIG. 3a taken along the line X—X'.
Figure 3C:
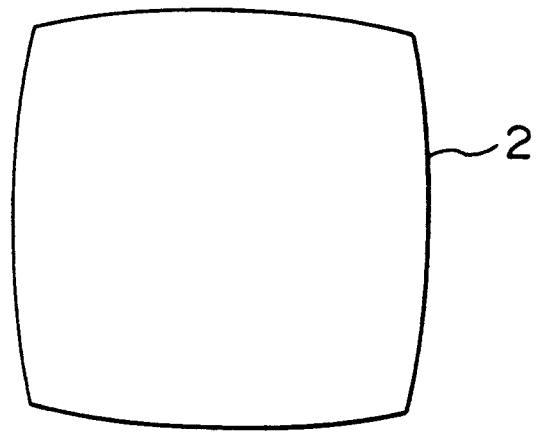
FIG. 3c is a top sectional view f the sintered body of FIG. 3b taken along the line Y—Y'.
Figure 4:
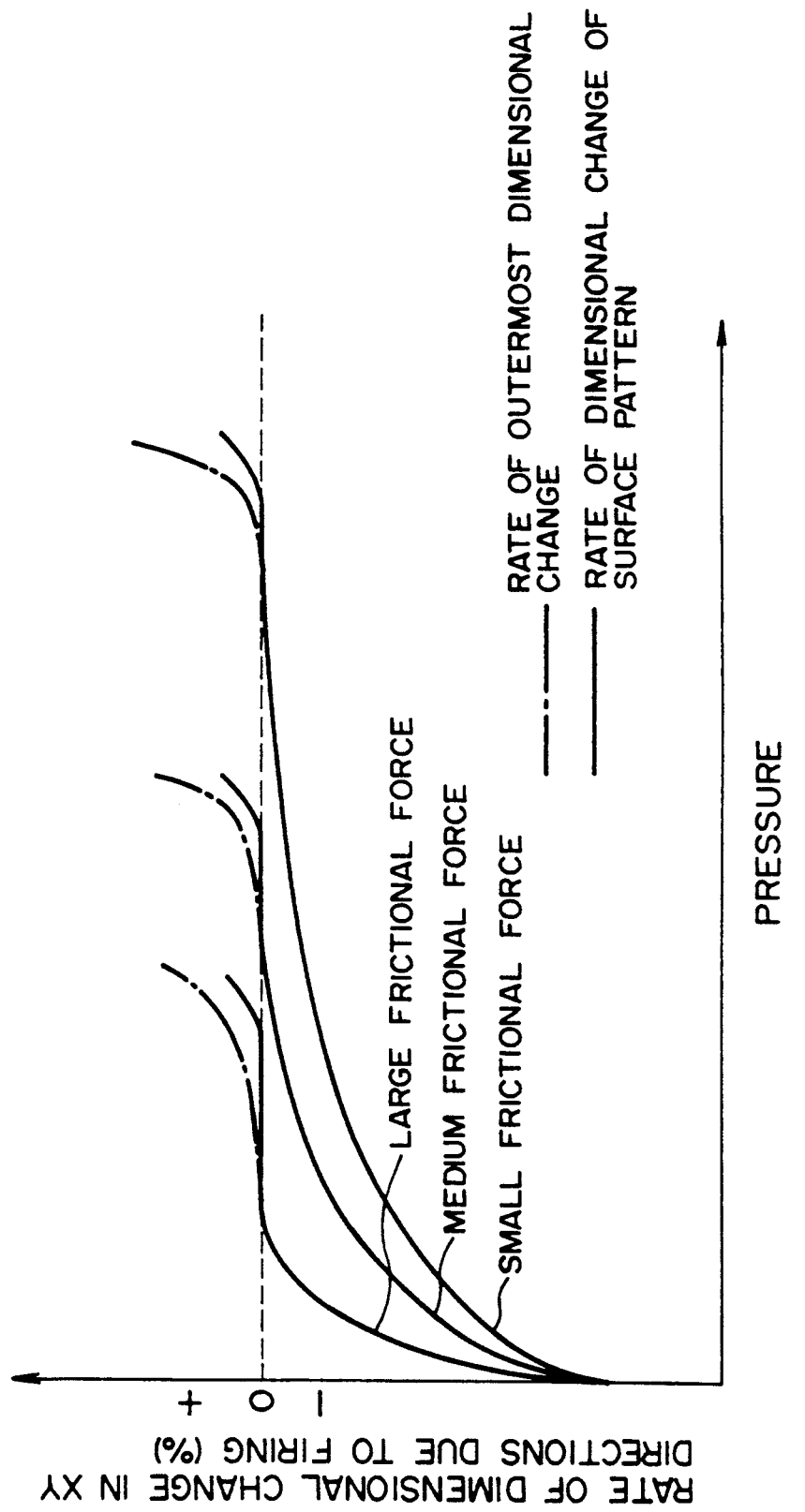
FIG. 4 is a graph which shows a general relation between an applied pressure and a rate of firing dimensional change (the surface to which a pressure is applied: XY directions) when a frictional force exerted between the laminate to which a pressure is applied and the material for applying the pressure is changed.
Figure 5A:
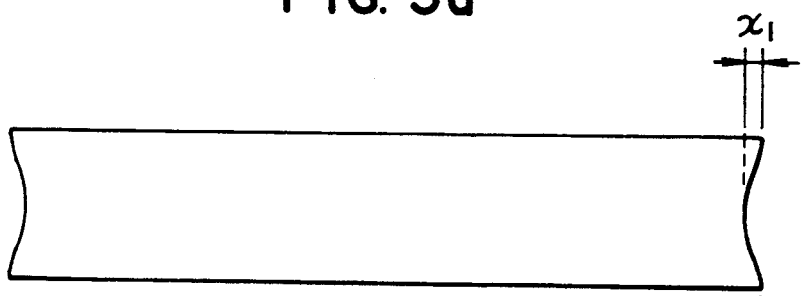
FIGS. 5a, b and c show an example of an actually obtained shape of the section perpendicular to the surface of sintered body to which a pressure is applied when sintering is carried out under pressure onto the two opposite surfaces.
Figure 5B:
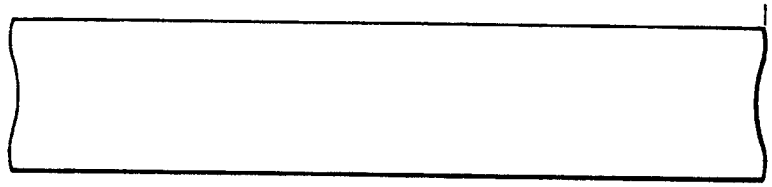
Figure 5C:
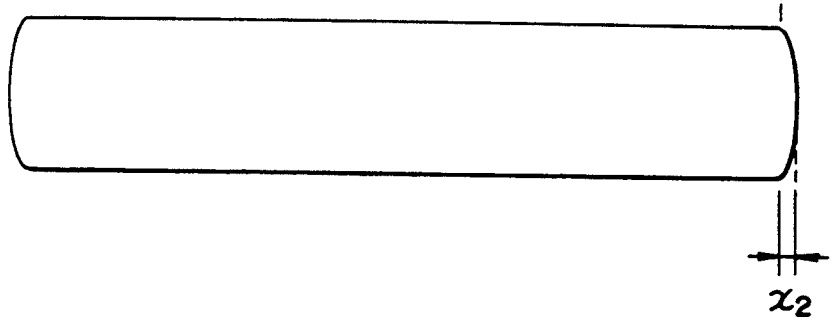
Figure 6A:
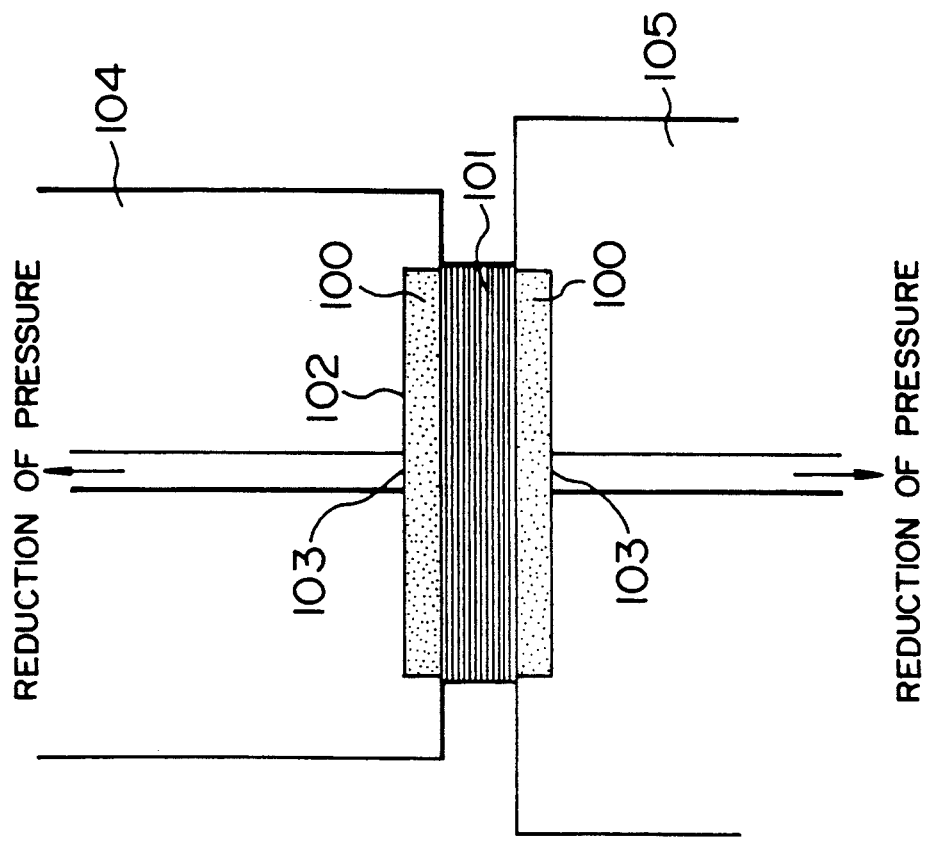
FIG. 6a and FIG. 6b show examples of methods of firing a laminate using a reduced pressure chuck device which gives a surface constraining force.
Figure 6B:
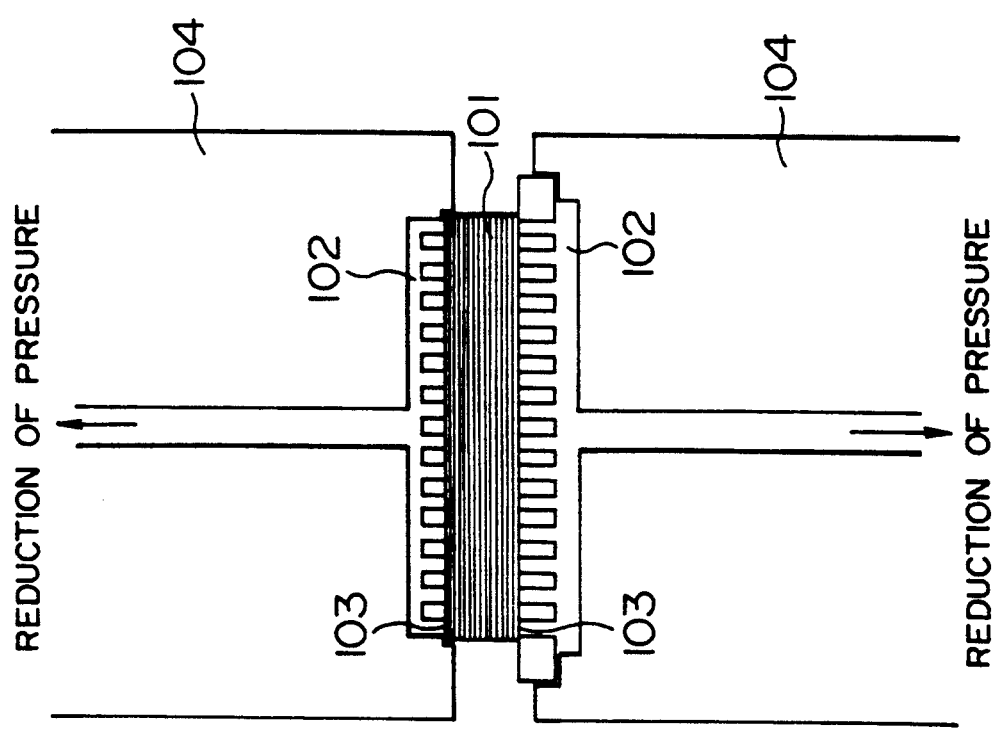
Figure 7A:
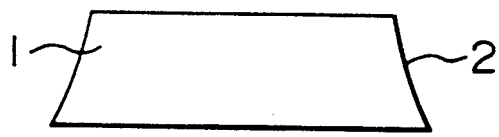
FIGS. 7a, b and c show examples of the shape of the cut surface of a sintered body fired with changing the coefficient of friction of the upper and lower surfaces.
Figure 7B:
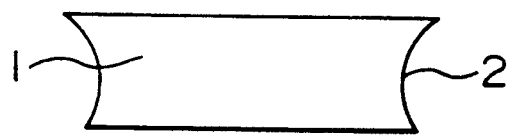
Figure 7C:
Figure 8A:
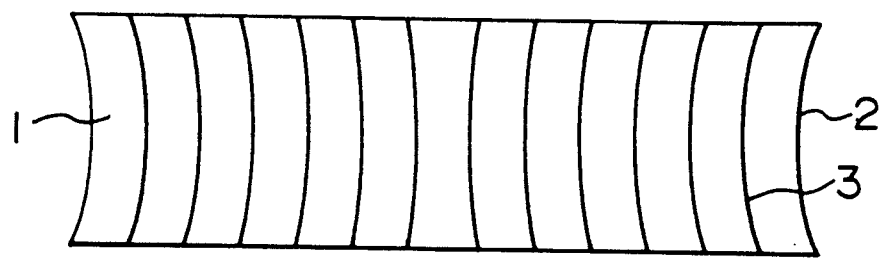
FIGS. 8a and 8b are sectional view of a sintered bodies which shows the shape of through-holes in the sintered bodies obtained by the method of the present invention.
Figure 8B:
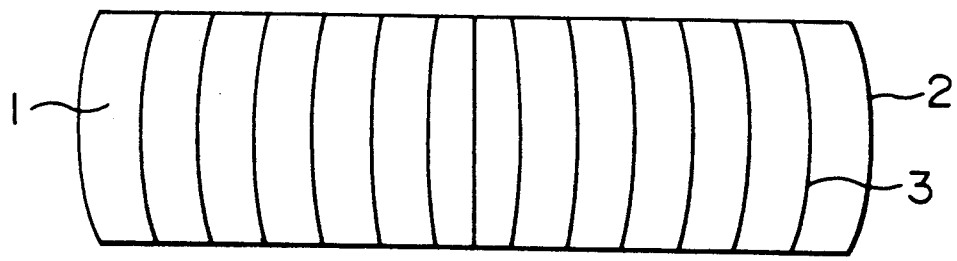
Figure 9A:
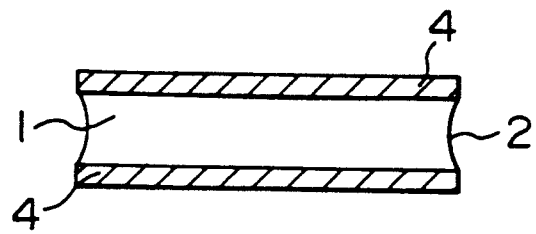
FIGS. 9a, 9b and 9d are sectional views of sintered composite bodies obtained by bonding fired substrates to the upper and lower surfaces of an unfired laminate and then firing the composite.
Figure 9B:
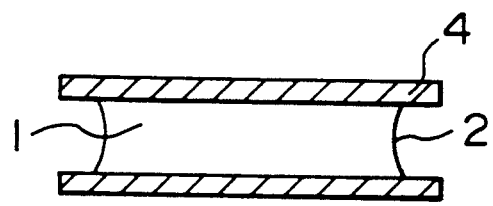
Figure 9C:
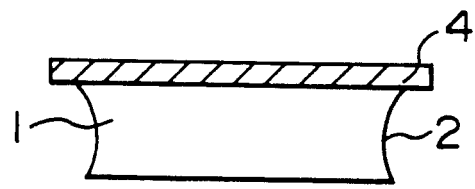
FIG. 9c is a sectional view of a sintered body obtained by bonding a fired substrate to one side of an unfired laminate and then firing the composite.
Figure 9D:
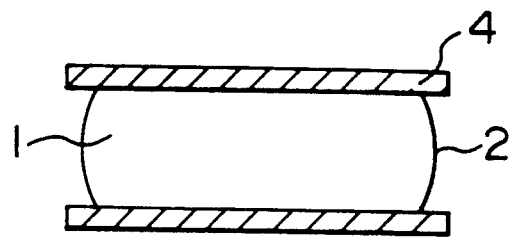
Figure 12:
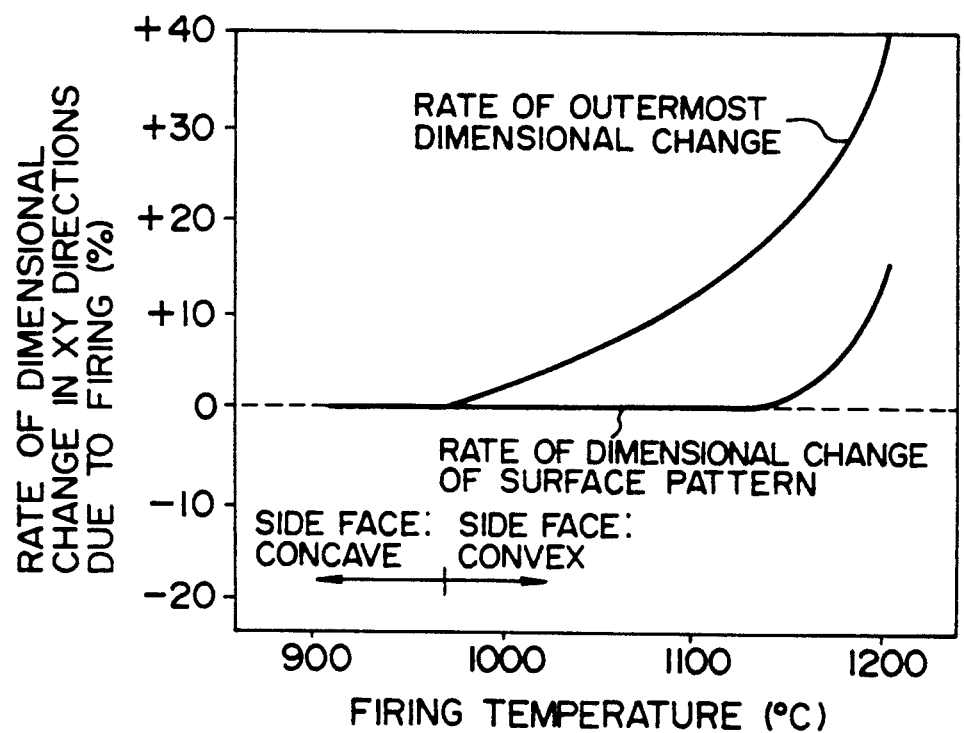
FIG. 12 is a graph which shows a relation between a firing temperature and a rate of the outermost dimensional change and shape of the side faces of the sintered body.

65 vol % of a borosilicate glass powder having an average particle size of 4 μm and comprising, in terms of oxide, 75-85% by weight of $SiO_2$, 10-30% by weight of $B_2O_3$, 1-10% by weight of $Al_2O_3$, up to 10% by weight of an alkali metal oxide and up to 5% by weight of an alkaline earth metal oxide and 35 vol % of an alumina powder having an average particle size of 3 μm were mixed and thereto were further added an acrylic resin binder, a plasticizer and a solvent. Then, they were wet ball milled for 24 hours to prepare a slurry. Thereafter, green sheets were prepared from the slurry and a wiring was printed thereon using a Cu conductor paste in the same manner as in Example 1. A laminated body was made by stacking thirty (30) of the green sheets thus obtained. The resulting laminate was nipped by a reduced pressure chuck device made of a heat resistant ceramic similar to that of FIG. 6a which was fitted to or built in a cylinder capable of precisely controlling the position and pressure so that substantially no weight was applied to the laminate. Then, the experiments were conducted. The laminate was fired at a temperature of 900°-1200° C. for 2 hours in humidified nitrogen with constraining the surfaces, during which heating from room temperature to about 600° C. was carried out at a low rate of 50° C./hr or less. During the firing, binder burn-out was sufficiently effected by a gas stream which passed from the free surfaces (side faces) over the constrained surface and was discharged from the holes of the chuck. The relation between the firing temperature and the rate of outermost dimensional change of the resulting sintered body is shown in FIG. 12. When the firing temperature exceeded 970° C., the change of the side face due to creep increased, the shape became convex and the outermost dimension also increased as corresponded thereto. When the firing temperature exceeded 1150° C., the rate of change in Z direction exceeded 60% and the laminate began to collapse.

EXAMPLE 3

60% by weight of a glass ceramic powder (2 μm in average particle size) comprising, in terms of oxide, 0.05-25% by weight of MgO, 0.05-25% by weight of CaO, 20-35% by weight of $Al_2O_3$, 20-55% by weight of $B_2O_3$, 0-25% by weight of $SiO_2$, 0-5% by weight of an alkali metal oxide, 0-5% by weight of ZnO, and 0-20% by weight of PbO with the total amount being 100% and 40% by weight of an alumina powder having an average particle size of 1 μm were mixed and thereto were further added a water-soluble acrylic resin binder, a dispersant, an antifoamer and a solvent containing water. Then, they were wet ball milled for 24 hours to prepare a slurry. Thereafter, in the same manner as in Example 1, green sheets were prepared, followed by forming via-wirings and a wiring circuit and electrode layers on the green sheets using an Ag conductor paste. Furthermore, in the layer positioned as the uppermost layer of the laminate were formed via wirings and on the sheet were formed wirings and electrode layers using an Au conductor paste. One hundred of these green sheets printed with various wiring circuits were stacked and laminated by applying pressure and heat to make a multi-layer ceramic compact body having wiring formed three-dimensionally. The thickness of this laminate was about 22 mm.

This compact body was put on an alumina porous plate and an alumina porous plate was also put on the upper surface of the compact body. Under a pressure of 2000 g/cm² thereon, the laminate was fired in air at a slow heating rate of 50° C. or lower from room temperature to about 600° C. to sufficiently effect binder burn-out. Successively, firing mainly for densification of the substrate was carried out at 750° C. for 1 hour and further firing at 950° C. for 1 hour was carried out for crystallization of the substrate portion and final densification of the conductor and the substrate portion.

The average shrinkage of the surface layer in X,Y direction was zero (0) and the side faces had a concave shape. The observation of the section of the sintered body revealed that the sintered body obtained in this example considerably decreased in the amount of voids and its dimension than a product fired under no pressure and had a four-point bending strength of about 300 MPa, which was much higher than that of the fired product under no pressure.

EXAMPLE 4

A powder mixture comprising 70-80% by weight of mullite ($3Al_2O_3 \cdot 2SiO_2$; average particle size: 3 μm) and 20-30% by weight of $SiO_2$, 0.3-10% by weight of $Al_2O_3$, and 0.3-2% by weight of MgO as sintering aids (total amount 100%), PVB, a plasticizer and a solvent were wet ball milled for 24 hours to prepare a slurry. In the same manner as in Example 1, green sheets were prepared, followed by forming via wirings and electrode layer on the green sheets using a W conductor paste. Many of these sheets printed with various wiring circuits were stacked and laminated by applying pressure and heat to make a multi-layer ceramic compact body having the three-dimensionally formed wiring. This compact body was put on a boron nitride plate having a surface roughness (Ra) of about 2-3 μm and previously heated to about 800° C. at a low rate of 100° C./hr or less to sufficiently carry out binder burn-out. At this stage, no shrinkage occurred in the compact body. Then, a boron nitride plate having a surface roughness of about 2-3 μm which was the same as that of the above-mentioned bottom boron nitride plate was put also on the upper surface of the compact body and the compact body was fired at 1670° C. for 5 hours under pressure in a mixed gas stream comprising nitrogen, hydrogen and water vapor.

Figure 13:
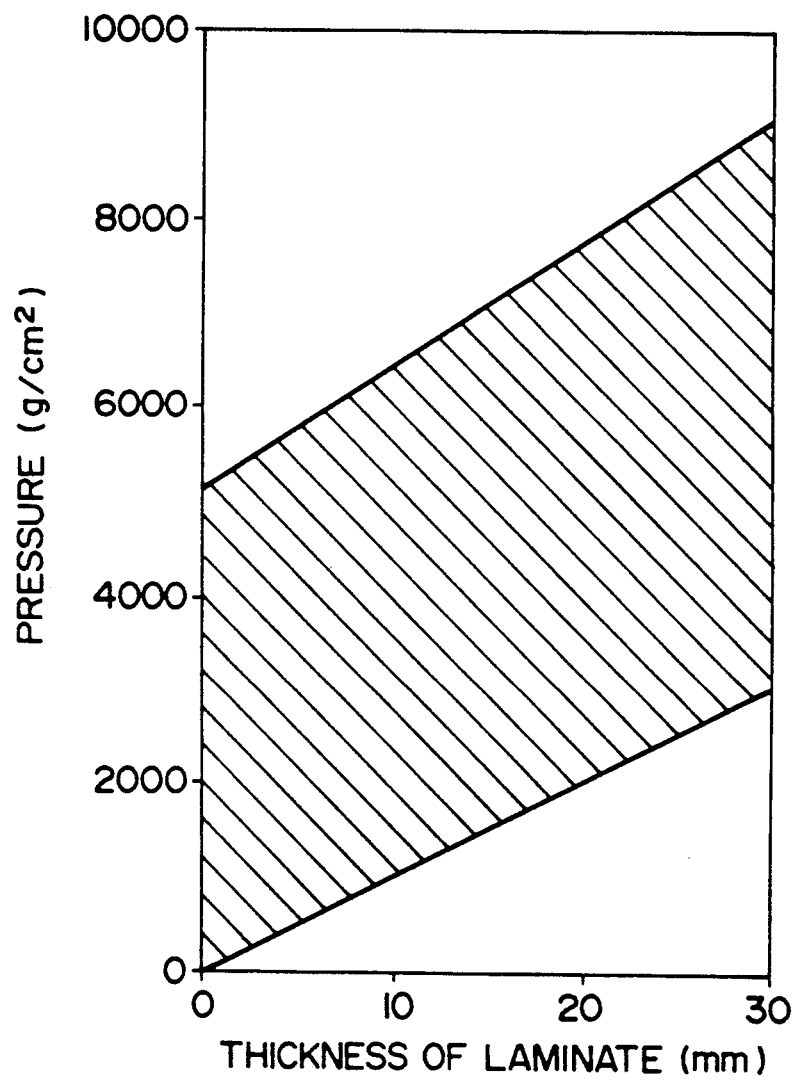
FIG. 13 shows, in relation with the thickness of laminate, an optimum range of an applied pressure for an average shrinkage in XY directions due to the sintering being made substantially zero (0) and for maintaining the shape of the side faces in an optimum range.

Laminated bodies of different thicknesses were prepared with changing the number of the green sheets by the above method and firing shrinkage under various pressures applied was examined. It was found that the average shrinkage of the surface layer in X,Y directions was able to be made zero (0) by applying a pressure of about 1700 g/cm² when the thickness of the compact body was 10 mm and by applying a pressure of about 3500 g/cm² when the thickness was 20 mm. FIG. 13 shows a relation between the thickness of the compact body and the range of pressure necessary to obtain an average rate of dimensional change of the surface pattern in X,Y directions of 0.5% or less and an average curvature radius of the side faces of ¼ or more of the thickness.

Observation of the section of the sintered body shows that voids in the sintered body of this example more decreased than those of the present fired under no pressure. The sintered body had a four-point bending strength of about 350 MPa, which was improved as compared with that of the product fired under no pressure.

Moreover, the boron nitride plate was not reacted with the sample fired in this example and thus the pattern of irregularities on the boron nitride plate was completely transferred onto the surface of the sample.

EXAMPLE 5

60 vol % of a borosilicate glass powder having an average particle size of 2 μm and comprising, in terms of oxide, 65-85% by weight of $SiO_2$, 10-30% by weight of $B_2O_3$, 1-10% by weight of $Al_2O_3$, up to 10% by weight of an alkali metal oxide and up to 1% by weight of others, 20 vol % of an alumina powder having an average particle size of 1 μm and 20 vol % of a mullite powder having an average particle size of 2 μm were mixed and thereto were further added a water-soluble acrylic resin binder, a plasticizer, a dispersant, an antifoamer and a solvent containing water. Then, they were wet ball milled for 24 hours to prepare a slurry. Thereafter, in the same manner as in Example 1, green sheets were prepared and a wiring was printed thereon using a Cu conductor paste. Forty (40) of the green sheets thus obtained were stacked to obtain two compact bodies. The respective compacts were sandwiched between two alumina porous plates (porosity: about 50%, average pore size: 8 μm, and thermal expansion coefficient: $7 \times 10^{-6}$/°C.) and two mullite porous plates (porosity: about 40%, average pore size: 5 μm, and expansion coefficient: $4 \times 10^{-6}$/°C.) and were fired at 950° C. for 2 hours in a mixed gas stream comprising nitrogen, hydrogen and water vapor under a pressure of 3500 g/cm² thereon. Binder burn-out was sufficiently effected by heating at a low rate of 100° C./hr or less and the increasing pressure of the gas atmosphere to higher than normal atmospheric pressure to accelerate the diffusion of the humidified gas into the laminates. The rate of dimensional change of the surface pattern of the sintered multi-layer ceramic body due to firing was zero (0) in both of the sintered bodies and side faces thereof were curved in the form of convex.

The bending strength of the sintered bodies obtained above was measured in the direction at which the maximum tension was applied to the face fired in contact with the porous plate. The bending strength of the sintered body in which alumina porous plates were used was higher than that of the sintered body in which mullite porous plates were used. It is considered that this is because the thermal expansion coefficient of the alumina porous plate was higher than that of the resulting sintered body ($3.8 \times 10^{-6}$/°C.) and this causes the generation of compression stress on the surface of the sintered body in the course of cooling after completion of sintering.

EXAMPLE 6

50% by weight of a borosilicate glass powder having an average particle size of 4 μm and comprising, in terms of oxide, 65-85% by weight of $SiO_2$, 10-30% by weight of $B_2O_3$, 1-10% by weight of $Al_2O_3$, up to 10% by weight of an alkali metal oxide and up to 1% by weight of others and 50% by weight of an alumina powder having an average particle size of 2 μm were mixed and thereto were further added a methacrylic resin binder, a plasticizer and a solvent. Then, they were wet ball milled for 24 hours to prepare a slurry. Green sheets were prepared from this slurry by a doctor blade method and via wirings and surface wirings were formed using a Cu conductor paste by a printing method. Three laminates were prepared by stacking sixty (60) of the green sheets obtained above, respectively. Alumina porous sheets were inserted between these laminates and additionally alumina porous sheets were provided on both the upper and lower surfaces thereof. The laminates were fired together at 950° C. for 2 hours in humidified nitrogen under a pressure of 1000 g/cm$^2$ on the upper and lower surfaces, during which binder burn-out was sufficiently effected by elevating the temperature at a low rate of 50° C./hr or less from room temperature to about 600° C. The average shrinkage of the surface layer of the sintered multi-layer ceramic body in X,Y direction was zero (0) and the shape of the side faces was concave.

EXAMPLE 7

Figure 14A:
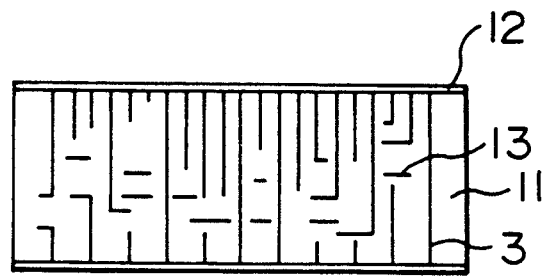
FIG. 14a is a sectional view which shows an example of the laminate before subjected to firing of the sintered multi-layer ceramic body of the present invention.
Figure 14B:
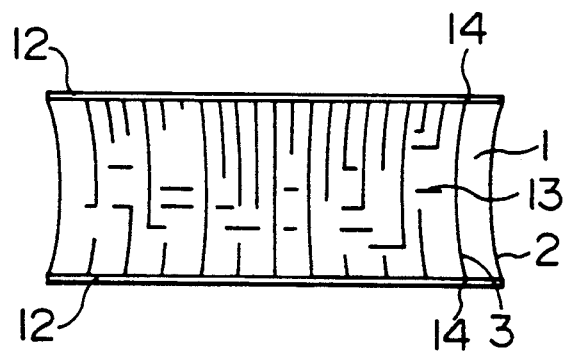
FIG. 14b is a sectional view which shows an example of the sintered multi-layer ceramic body of the present invention.

A powder mixture comprising 70-80% by weight of mullite (3Al$_2$O$_3$.2SiO$_2$; average particle size: 3 μm) and 20-35% by weight of SiO$_2$, 1-5% by weight of Al$_2$O$_3$, and 0.1-5% by weight of an alkaline earth metal oxide as sintering aid (total amount 100%), a water-soluble acrylic resin binder, a plasticizer, a dispersant, an antifoamer and a solvent containing water were wet ball milled for 24 hours to prepare a slurry. In the same manner as in Example 1, green sheets were prepared from the slurry. Separately, three slurries were prepared by wet ball milling for 24 hours only the above mullite powders (without adding any sintering aids), an alumina powder (average particle size: 1 μm), and a boron nitride powder (average particle size: 2 μm) to which a water-soluble acrylic binder, a plasticizer, a dispersant, an antifoamer and a solvent containing water were added, respectively. Green sheets were also prepared from the slurries in the same manner as in Example 1. Via wirings and wiring circuits and electrode layers were formed using a mixed conductor paste of W and Mo for the green sheets made using the slurry containing mullite and sintering aids. The fifty (50) of the green sheets thus obtained and printed with various wiring circuits were stacked under registration. On the uppermost and lowermost surfaces of this laminate were put green sheets with no sintering aids of mullite, alumina or boron nitride. The respective laminates were laminated by applying pressure and heat, to thereby obtain three kinds of multi-layer ceramic compact bodies in which a wiring was three-dimensionally formed. The respective compacts were sandwiched between two silicon carbide plates having a surface roughness (Ra) of about 3 μm and were fired at 1650° C. for 3 hours in a mixed gas stream of nitrogen, hydrogen and water vapor under a pressure of 2500 g/cm$^2$ on the upper and lower surfaces, during which binder burn-out was sufficiently effected by slowly heating at a rate of 100° C./hr or less to about 1200° C. By this procedure, sintered bodies having side faces curved in the form of concave were obtained. FIG. 14 shows the section of the laminated compact and the sintered body at the central portion perpendicular to the surface to which pressure was applied.

According to this method, no bonding occurred between the fired sample and the silicon carbide plates. The layers containing no sintering aids, of mullite, alumina and boron nitride which were provided on the surfaces of the samples, remained unsintered. The layers could easily be removed by gentle abrasion, whereby the through-hole or via hole wiring portions (terminal pad) formed in the internal layer portion could be exposed to the surface. The abraded surface was flat and relatively smooth. For part of the samples, after the surfaces were further subjected to the abrasion treatment to make them smooth, a thin film wiring layer of polyimide was formed and many LSI chips were mounted to construct multi-chip modules.

EXAMPLE 8

Green sheets of a composite material of the same borosilicate glass and alumina filler as in Example 1 and green sheets of a Pb(Mg$_{1/3}$Nb$_{2/3}$)O$_3$—Pb(Zn$_{1/3}$Nb$_{2/3}$)O$_3$ type high dielectric constant material capable of being sintered at a low temperature were prepared. Holes of 100-150 μm in diameter were made in these green sheets by a punching method and filled with an Ag conductor paste to form via wirings. A wiring was further printed with the Ag paste on the green sheets of the borosilicate glass/alumina filler composite material.

An electrode portion was formed by printing on the green sheets of a Pb(Mg$_{1/2}$Nb$_{2/3}$)O$_3$—Pb(Zn$_{1/3}$Nb$_{2/3}$)O$_3$ type high dielectric constant material to form a capacitor of high capacity. Ten green sheets on which the wiring and electrode were thus printed were layered and laminated by applying heat and pressure under conditions of 100° C. and 100 kg/cm$^2$ to make a multi-layer ceramic compact. The thickness of the resulting compact body was about 1 mm.

This compact was sandwiched between alumina porous plates and fired at 950° C. for 0.5 hour in air under a pressure of 450 g/cm$^2$ thereon, during which binder burn-out was sufficiently effected by elevating the temperature at a slow rate of 100° C./hr or less from room temperature to about 600° C. The side end portion of the thus sintered substrate was partly removed by grinding for using them as LSI chip carriers arranged at a high density.

The resulting substrate was subjected to a temperature cycle test under conditions of −55°-150° C. and 1 cycle/hr. No cracks occurred even after repetition of 1000 cycles. Furthermore, LSI chips were mounted onto the surface of the capacitor built-in substrate obtained in this example by a CCB method using small solder balls. In this case, the resulting substrate had no warpage and there were no irregularities in the through-hole portion and besides, since the surface positional accuracy of the through-holes was high, yield could be much improved in bonding and connection to LSI chips.

EXAMPLE 9

Two kinds of borosilicate glasses which differed in softening temperature (800° C., 900° C.) and which comprised, in terms of oxide, 65-85% by weight of SiO$_2$, 10-30% by weight of B$_2$O$_3$, 1-10% by weight of Al$_2$O$_3$, up to 10% by weight of an alkali metal oxide and up to 5% by weight of others were prepared. 75 vol % of the respective glasses powdered of 2 μm in average particle size and 25 vol % of an aluminum powder of 1 μm in average particle size were mixed and thereto were further added a water-soluble acetal binder, a plasticizer, a dispersant, an antifoamer and a solvent containing water. They were wet ball milled for 24 hours to prepare a slurry. In the same manner as in Example 1, green sheets were prepared from the slurry and via wirings and wirings and electrode layers thereon were formed using a Cu conductor paste. Sixty (60) of the green sheets on which various wirings were thus printed were layered under registration. In this case, the green sheets which were made using the glass having a higher softening temperature and on which the wirings were formed, were used as upper two layers and lower two layers of the laminate. These green sheets were laminated together by applying heat and pressure to form a multi-layer ceramic compact body in which the wirings were three-dimensionally formed. This compact body was put on an alumina porous sheet (porosity: about 70%, and average pore size: 15 $\mu$m) and previously heated to about 650° C. at a low rate of 50° C./hr or less to sufficiently effect binder burn-out. At this stage, no shrinkage occurred in the surface pattern. Thereafter, the same porous sheet as above was put on the upper surface of the compact and the compact was fired at 950° C. for 2 hours in a mixed gas stream comprising nitrogen, hydrogen and water vapor under pressure thereon. An excellent substrate having quite a little carbon residue was obtained.

EXAMPLE 10

To composite powders of the same borosilicate glass and alumina filler as Example 2 were added a water-soluble acrylic binder, a plasticizer, a dispersant, an antifoamer and a solvent containing water, followed by wet ball milling for 24 hours to prepare a slurry. In the same manner as in Example 2, green sheets were prepared, and via wirings and wiring circuits and electrode layers were formed thereon using a conductor paste comprising mixed powders of 60 vol % of Cu and 40 vol % of W. Fifty (50) of the green sheets on which various wiring circuits were thus printed were layered and registered so that these wirings were three-dimensionally connected to each other and then laminated by applying heat and pressure to obtain a multi-layer ceramic compact body. This compact was heated to about 600° C. at a low rate of 50° C./hr or less in a mixed gas stream of nitrogen, hydrogen and water vapor to sufficiently effect binder burn-out.

Separately, two fired substrates of high strength mullite in which via-holes and surface wiring conductors of W were formed with a high dimensional accuracy were prepared. These substrates were put on the upper and lower surfaces of the above-mentioned compact which had been subjected to the binder burn-out with registering so that the wirings were three-dimensionally connected to each other, followed by firing at 950° C. for 2 hours in a non-oxidizing atmosphere under a pressure of about 200 g/cm² on the surface of the mullite substrates. The surface roughness (Ra) of the fired substrate was about 1 $\mu$m (the face which contacted the laminate) and about 0.3 $\mu$m (the exposed face which did not contact the laminate). The size of the laminated face thereof was the same as the area of the unfired laminate portion.

The thus obtained sintered multi-layer ceramic body was completely integrated and the side faces thereof were slightly convex in the portion other than the substrates. The conductor portion formed using a mixed paste of Cu and W was highly dense since Cu sufficiently wetted the surface of W by firing and, besides, was an integral conductor in which W was uniformly dispersed in the Cu matrix, since Cu does not react with W. Moreover, since a composite conductor of Cu and W is low in thermal expansion coefficient, the W conductor portion and ceramic portion of the surface layer were both integrated with a high reliability. The sintered body obtained in this example had a strength of about 280 MPa which was higher than that of the pressureless sintered product and was much improved as compared with the sintered body which included no fired mullite substrate.

EXAMPLE 11

50 vol % of a borosilicate glass powder of 2 $\mu$m in average particle size (softening point: 850° C. and point of incipient deformation: 610° C.) which comprised, in terms of oxide, 65-85% by weight of $SiO_2$, 10-30% by weight of $B_2O_3$, 1-10% by weight of $Al_2O_3$, up to 10% by weight of an alkali metal oxide and up to 1% by weight of others, 20 vol % of an alumina powder of 1 $\mu$m in average particle size and 30 vol % of a silica powder of 1 $\mu$m in average particle size were mixed and thereto were further added a water-soluble acetal binder, a plasticizer, a dispersant, an antifoamer and a solvent containing water, followed by wet ball milling for 24 hours to prepare a slurry. In the same manner as in Example 1, green sheets were prepared from the slurries and via wirings and wiring circuits and electrode layers were formed on the green sheets using a Cu conductor paste.

Separately, two fired substrates of highly thermal conductive aluminum nitride (AlN) having many via holes formed with a high dimensional accuracy by a laser which were filled with fine blocks of W were prepared. Thirty (30) of the above green sheets having various printed wiring circuits were layered and the above aluminum nitride substrates were put on the upper and lower surfaces of the above laminate, followed by registration so that these wirings were three-dimensionally connected to each other and laminating them by applying pressure and heat to produce a multi-layer ceramic compact body. The surface roughness (Ra) of the fired substrate was about 2 $\mu$m (the face which contacted the laminate) and about 0.5 $\mu$m (the exposed face which did not contact the laminate). The size of the laminated face was larger than the area of the unfired laminate portion. This laminate was fired at 900° C. for 2 hours in a non-oxidizing atmosphere under a pressure of about 300 g/cm² from the AlN substrate side. Elevation of the temperature from room temperature to about 600° C. was carried out at a low rate of 50° C./hr or less to sufficiently effect binder burn-out. In this case, a part of Cu wiring formed on the portion other than an AlN substrate spread to the surface W block portion and wetted the portion to completely fill the via holes made in the AlN substrate and fine voids between the W blocks and via holes which were present before sintering.

Figure 15:
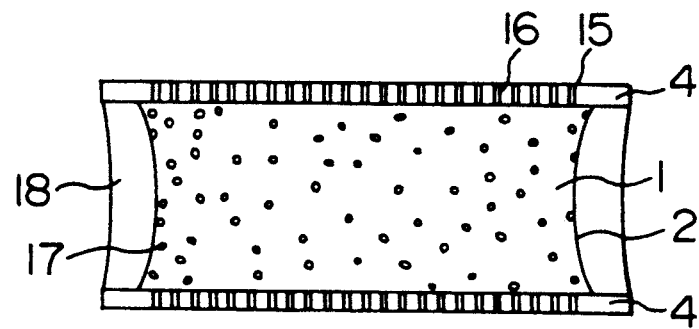
FIG. 15 is a sectional view which shows an example of the sintered multi-layer ceramic body to which fired substrates are provided.

The obtained multi-layer ceramic sintered body was completely integrated and the side faces thereof were concaved in the portion other than the fired AlN substrates. Furthermore, the portion of the resulting multi-layer ceramic sintered body other than the AlN substrates had a very low relative dielectric constant of 3.8, since the material per se had a low relative dielectric constant and besides had a relatively low density of about 87%. Thus, the sintered multi-layer ceramic body was useful as a substrate which requires high-speed transmission. The strength of the whole multi-layer substrate had practically no problems because the strength thereof was ensured by the high-strength AlN substrates which were applied to the surface thereof. Moreover, in order to improve the thermal conductivity of the whole of this multi-layer substrate, with a solder paste was filled the concave portion of the side faces surrounded by the two outermost AlN substrates and the sintered glass portion and was molten at low temperatures, to thereby bond the two highly thermal conductive AlN substrates and form a path of heat. Thus, when LSI chips were mounted to one surface and actuated, the heat generated from the chips can be diffused in the whole multi-layer substrate through the AlN substrates on the surface of the multi-layer substrate and the solder formed on the side faces of the multi-layer substrate and, as a result, thermal diffusion is remarkably improved. According to this method, it is also possible to improve reliability by air-tightly sealing the low density portion (containing many voids) exposed to the side faces and, hence, this substrate is very useful as multi-layer substrate for a large computer which requires high reliability. FIG. 15 shows the section of the multi-layer substrate obtained in this example. The wiring formed in the glass/ceramics composite material portion in the center of the sintered body was omitted in FIG. 15.

EXAMPLE 12

65 vol % of a borosilicate glass powder of 3 μm in average particle size which comprised, in terms of oxide, 65–85% by weight of $SiO_2$, 10–30% by weight of $B_2O_3$, 1–10% by weight of $Al_2O_3$, up to 10% by weight of an alkali metal oxide and up to 1% by weight of others, 10 vol % of an alumina powder of 1 μm in average particle size and 25 vol % of hollow silica beads of 5 μm in average particle size were mixed and thereto were further added an acrylic resin binder, a plasticizer, and a solvent, followed by wet ball milling for 20 hours to prepare a slurry. In the same manner as in Example 1, green sheets were prepared from the slurry and via wirings and wiring circuits and electrode layers on the green sheets were formed using a Cu conductor paste. Separately, a dense and high-strength fired substrate of mullite having via wiring and surface wiring conductors of W formed with a high dimensional accuracy, and a mullite sintered substrate in which a plurality of through-holes were previously made using $CO_2$ laser with a high positional accuracy were prepared. If necessary, the wirings can be formed using a conductor paste on the surface of this substrate. Fifty (50) of the green sheets obtained above and the two substrates obtained above were layered so that the mullite substrates were provided as the uppermost layer and the lowermost layer of the final laminate. In this case, registration was conducted so that the wirings formed in the green sheets were three-dimensionally connected to each other and further the registration with the conductor portion formed on the green sheets was conducted. The surface roughness (Ra) of the mullite substrate was about 0.7 μm (the face which contacted the laminate) and about 0.3 μm (the exposed face which did not contact the laminate). The size of laminated face of the substrate was the same as the area of the unfired laminate portion. This composite laminate was sandwiched between porous sheets (porosity: about 70% and average pore size: 10 μm) and was fired at 960° C. for 2 hours in a non-oxidizing atmosphere under a pressure of about 600 g/cm$^2$. Elevation of the temperature from room temperature to about 600° C. was carried out at a low rate of 50° C./hr or less to sufficiently effect binder burn-out, to thereby obtain a multi-layer ceramic substrate in which the side faces other than those of the mullite substrate were concave, the surface of one of the mullite substrates had a plurality of small holes (dimples) and a plurality of W conductor pads were formed on another mullite substrate. Positional accuracy of these pads was very high in sintering.

Then, with the small amount of a solder were filled the dimples formed on the lower side of the sintered body by printing and, thereafter, I/O pins were inserted in the dimples and the solder was molten to effect bonding and to form the connection between the conductor portion in the dimples and the pins. The bond strength of the I/O pins to the multi-layer substrate was about 12 times that of conventional pins which had no insert portion.

Figure 16:
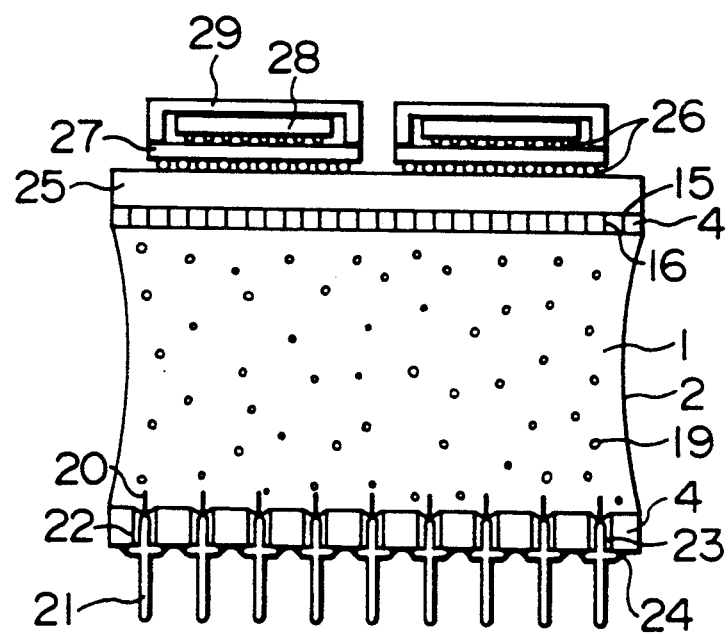
FIG. 16 is a sectional view which shows an example of a sintered multi-layer ceramic substrate to which fired substrates are applied and a packaged module structure of LSI chips which uses the sintered body.

On another mullite substrate, many thin film wiring layers of polyimide in which a Cu wiring was formed were produced and thereon were provided many LSI chips supported on carrier substrates to construct a multi-chip module. Large computers in which this module was used had a very high reliability and could attain high-speed transmission of signals. FIG. 16 shows the multi-layer substrate obtained in this example and one example of the structure of LSI chip packaging module in which the multi-layer substrate was used. A part of the wiring was omitted in FIG. 16.

EXAMPLE 13

65 vol % of a borosilicate glass powder of 4 μm in average particle size which comprised, in terms of oxide, 75–85% by weight of $SiO_2$, 10–30% by weight of $B_2O_3$, 1–10% by weight of $Al_2O_3$, up to 10% by weight of an alkali metal oxide and up to 5% by weight of an alkaline earth metal oxide, 15 vol % of an alumina powder of 3 μm in average particle size and 20 vol % of hollow silica beads of 10 μm in average particle size were mixed and thereto were further added an acrylic resin binder, a plasticizer, and a solvent, followed by wet ball milling for 24 hours to prepare a slurry. In the same manner as in Example 1, green sheets were prepared from the slurry and via wiring and wiring circuits and electrode layers were formed on the sheets using a Cu conductor paste. Separately, three fired aluminum nitride substrates having a high thermal conductivity in which many via wirings were formed with a high dimensional accuracy using an electron beam were prepared. Via wiring and wiring and electrode layer were also formed on these fired substrates using a Cu conductor paste. The Cu paste used herein were higher in a filling rate of Cu particles than the Cu paste used for the green sheets. Fifty (50) of the green sheets obtained above and the three AlN fired substrates obtained above were registered and layered so that the AlN substrates were provided as the uppermost layer, the lowermost layer and the central layer of the final laminate and the wirings were three-dimensionally connected to each other and then they were laminated by applying heat and pressure to obtain an integrated multi-layer ceramic compact body. The surface roughness (Ra) of the AlN substrate was about 1 μm (the face which contacted the laminate) and about 0.5 μm (the exposed face which did not contact the laminate). The size of the laminated face of the substrates provided as the uppermost and lowermost layers was larger than the area of the unfired laminate portion and that of the AlN substrate provided as the central layer was the same as the area of the unfired laminate portion. This laminate was fired at 970° C. for 2 hours in a non-oxidizing atmosphere under a pressure of about 500 g/cm$^2$ from the AlN substrate sides. Elevation of the temperature from room temperature to about 600° C. was carried out at a low rate of 50° C./hr or less to sufficiently effect binder burn-out.

Figure 17:
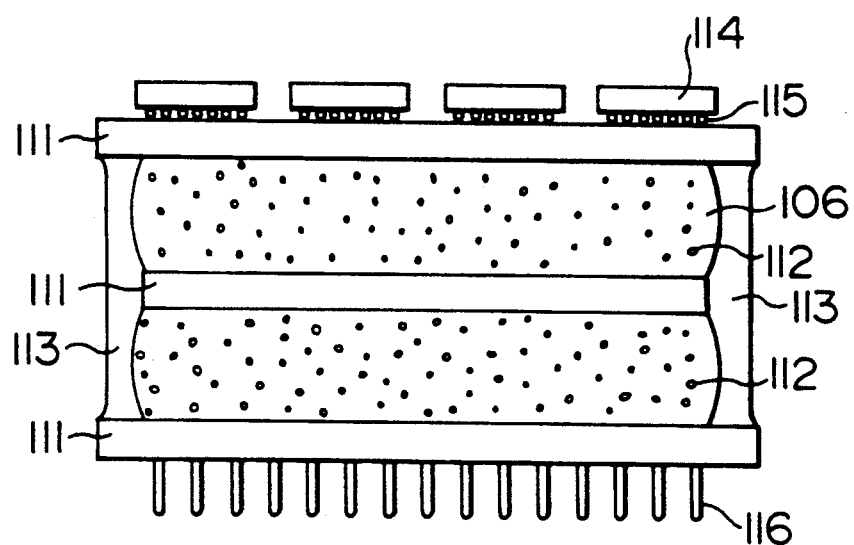
FIG. 17 and FIG. 18 are sectional views of the multi-layer circuit substrates obtained in the Examples of the present invention.

The side faces of the resulting multi-layer ceramic substrate other than those of the AlN substrates were convex. This portion had a very low relative dielectric constant of 3.9 and this is very useful as a substrate which requires high-speed transmission. The strength of the whole multi-layer substrate had practically no problems because the strength was ensured by the high-strength AlN substrates applied to the surface thereof. Moreover, in order to improve the thermal conductivity of the whole of this multi-layer substrate, with a solder paste was filled the concave portion of the side faces surrounded by the two outermost AlN substrates and the sintered glass portion. The solder was molten at low temperatures, to thereby bond the three AlN substrates and form a path of heat. Thus, when LSI chips were mounted to one surface and actuated, the heat generated from the chips can be diffused in the whole multi-layer substrate through the AlN substrates on the surface of the multi-layer substrate, and the solder formed on the side faces of the multi-layer substrate and, as a result, thermal diffusion is remarkably improved. FIG. 17 shows the section of the multi-layer substrate obtained in this example. The wiring formed inside the multi-layer substrate was omitted in FIG. 17.

EXAMPLE 14

Green sheets of a $BaTiO_3$ type material having a high dielectric constant were prepared, and via-wirings and electrode portions were formed by printing with a Pt conductor paste. A plurality of these green sheets were layered and fired to make a multi-layer ceramic capacitor in which a plurality of through-hole wirings and capacitor portions were formed. Separately, via wirings and surface wirings were formed by printing with an Ag—Pd conductor paste in the same green sheets comprising a composite material of the same borosilicate glass and alumina filler as used in Example 1. In a part of the green sheets were made holes larger than the above capacitor by a punching method. The above ceramic capacitor and a plurality of the green sheets cut to an area larger than the area of the laminated portion of the above capacitor were layered so that the capacitor was positioned inside the final laminate. In this case, the green sheet in which holes larger than the capacitor were made was simultaneously provided as the layer to which the capacitor was laminated. These were registered and layered so that the electrode and through-hole wiring of the capacitor were three-dimensionally connected to the wiring of other laminate. These were laminated by applying heat and pressure to obtain an integrated multi-layer ceramic compact body. The surface roughness (Ra) of the above multi-layered capacitor was about 0.3 μm. This laminate was sandwiched between alumina porous paltes and fired at 900° C. for 1 hour in air under application of pressure thereon.

Figure 18:
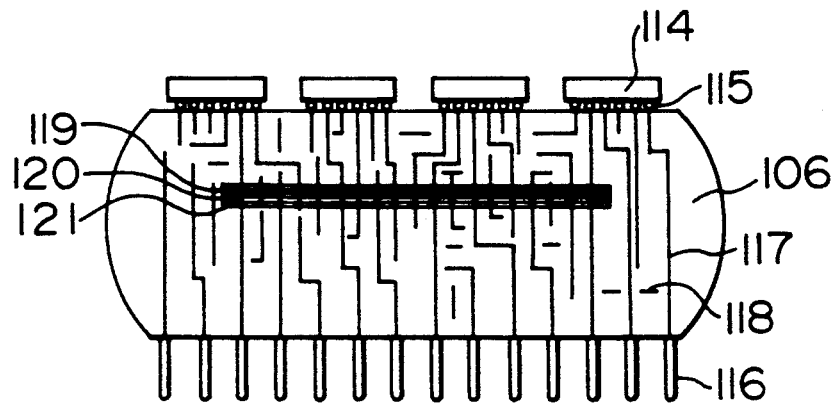

LSI chips were mounted to the surface of the capacitor built-in substrate obtained in this example by a CCB method using fine solder balls. In this case, an yield in bonding and connecting to the LSI chips could be much improved, since the resulting substrate had no warpage and irregularities in the through-holes and, besides, the surface positional accuracy of the through-holes was high. Moreover, the actuation noise of the LSI chips could be markedly diminished by the capacitor which was built in the substrate. FIG. 18 shows the section of the multi-layer substrate obtained in this example.

EXAMPLE 15

Green sheets of a $BaTiO_3$ type material having a high dielectric constant were prepared, and via-wiring and electrode portion were formed by printing with a Pd conductor paste. A plurality of these green sheets were layered and fired to make a plurality of multi-layer ceramic capacitors in which a plurality of through-hole wirings and capacitor portions were formed. Separately, one alumina fired substrate having a high strength in which a via wiring conductor of W was formed with a high accuracy was prepared. Furthermore, via wiring and surface wiring were formed by printing with an Ag—Pd conductor paste in the same green sheets comprising a composite material of the same borosilicate glass and alumina filler as used in Example 1. In a part of the green sheets were made holes larger than the above capacitor by a punching method. A plurality of the above fired ceramic capacitors and a plurality of the green sheets cut to an area larger than the area of the laminated portion of the above capacitor were arranged so that the capacitors were positioned inside the final laminate. In this case, the green sheet in which holes larger than the capacitor were made was simultaneously provided as the layer to which the capacitor was laminated. These were registered and layered so that the capacitors, the electrode and through-hole wiring of the fired alumina substrate were three-dimensionally connected to the wiring of other laminate. These were laminated by applying heat and pressure to obtain a multi-layer ceramic compact body. The surface roughness (Ra) of the above multi-layered capacitor was about 0.3 μm. This laminate was sandwiched between alumina porous sheets and fired at 900° C. for 1 hour in air under application of pressure thereon.

Figure 19:
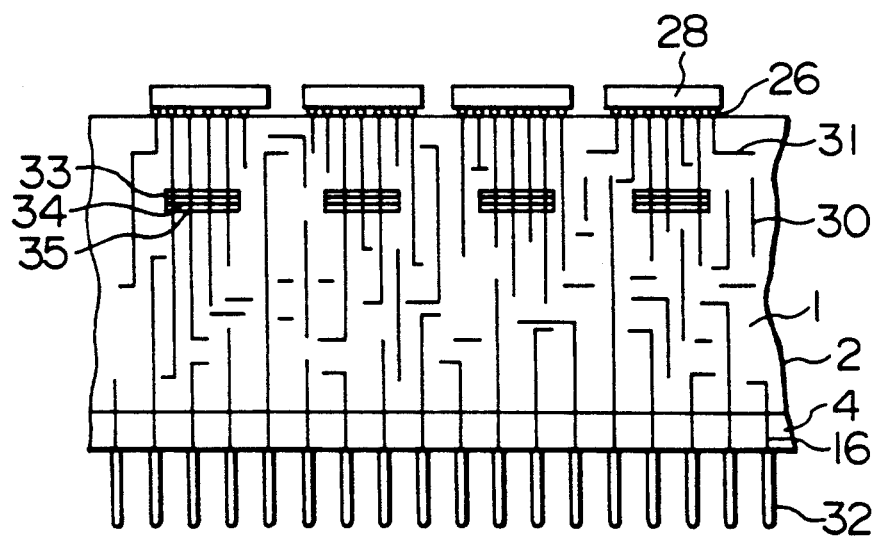
FIG. 19 shows the sectional view of the multi-layer circuit substrate obtained in the Example of the present invention and the packaged module structure of LSI chips using the substrate.

I/O pins were connected to the back side of the capacitor built-in multi-layer substrate obtained in this example with a solder, and LSI chips were mounted to the surface of the substrate by a CCB method using fine solder balls. In this case, the yield in bonding and connecting to the LSI chips could be much improved, since the resulting substrate had no warpage and irregularities in the through-holes and besides, surface positional accuracy of the through-holes was high. Moreover, the actuation noise of LSI chips could be markedly diminished by the capacitor which was built in the substrate. FIG. 19 shows the section of the multi-layer substrate obtained in this example and an example of the section of the LSI chip packaged module in which the substrate was used.

EXAMPLE 16

In the same manner as in Example 1, green sheets of 0.1 mm thick were prepared using a barium titanate powder of 0.5 μm in average particle size, a methacrylic resin binder, a plasticizer and a solvent. An electrode layer was formed on the green sheets using a Pd conductor paste by a screen printing method. Twenty-nine (29) of these green sheets and one unprinted green sheet as the uppermost layer, namely, totally thirty (30) of the green sheets were layered and laminated by application of pressure and heat to obtain a multi-layer ceramic compact body. The thickness of this compact was about 3 mm.

This laminate was sandwiched between SiC substrates having a surface roughness of 5 μm and fired at 1600° C. for 1 hour in air under a pressure of 800 l g/cm², Elevation of the temperature from room temperature to about 600° C. was carried out at a low rate of 50° C./hr or less for binder burn-out.

The average shrinkage of the surface layer of the resulting sintered multi-layer ceramic body in X, Y directions was nearly zero (0) and the side aces were in the form of concave. The shrinkage in Z direction was about 45%, which was much greater than about 20% which was a shrinkage in Z direction of a pressureless fired body and, thus, the thickness of the dielectric layer portion was very thin.

Figure 20:
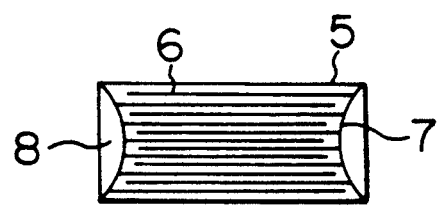
FIG. 20 is a central sectional view of the multi-layered capacitor obtained in the Example of the present invention.

An external electrode was attached to the concave portion of the side faces by baking and the sintered body was subjected to the temperature cycle test under the conditions of −55° C.-150° C., 1 cycle/hr. No cracks were generated in the bonding portion of the external electrode or in the elements even after repetition of 1000 cycles. A section of central portion of the resulting multi-layered capacity is shown in FIG. 20.

EXAMPLE 17

In the same manner as in Example 1, green sheets of 0.15 mm thick were prepared using a $PbZrO_3$—$PbTiO_3$ powder of 0.7 μm in average particle size obtained by previous calcination, a methacrylic resin binder, a plasticizer and a solvent. An internal electrode layer was formed on the green sheets using an Ag-Pd conductor paste by screen printing. Nineteen (19) of these green sheets and one unprinted green sheet as the uppermost layer, namely, totally twenty (20) green sheets were layered and laminated by application of pressure and heat to obtain a multi-layer ceramic compact body. The thickness of this compact body was about 2 mm.

This compact body was sandwiched between alumina porous substrates and fired at 1100° C. for 1 hour in air under a pressure of 600 g/cm². Elevation of the temperature from room temperature to about 500° C. was carried out at a low rate of 50° C./hr or less for binder burn-out.

The average shrinkage of the surface layer of the resulting sintered multi-layer ceramic body in X, Y directions was nearly zero (0) and the side faces were in the form of concave. An external electrode was attached to the concave portion of side faces by baking to make a multi-layered ceramic actuation device. This was subjected to the temperature cycle test under the conditions of −55° C.-150° C. and 1 cycle/hr. No defects such as cracks were generated in the bonding portion of the external electrode or in the elements and no deterioration of characteristics was recognized even after repetition of 1000 cycles.

What is claimed is:

1. A method of producing a multi-layered ceramic substrate, which comprises the steps of:
    preparing a laminate of ceramic green sheets, said laminate having outermost surfaces and side faces, each of said green sheets having a pattern of a sinterable mixture comprising conductor particles and an organic binder on at least one surface thereof and through-holes filled with a sinterable conductor material;
    heating the laminate to remove the organic binder; and
    firing the laminate together with the insertable mixture and the conductor material under a load such that dimensional change of the outermost surfaces in XY directions of the laminate compared with dimensions of outermost surfaces of a pre-fired laminate is minimized by constraining the shrinkage in the outermost surfaces thereof, while the side faces of the laminate each wholly curves outwardly to form a convex along a direction of the thickness of the laminate.

2. A method for producing a sintered multi-layer ceramic body according to claim 1, wherein the side face of the laminate is not constrained in firing.

3. A method for producing a sintered multi-layer ceramic body according to claim 1, wherein the pressure or the constraining force is transmitted through a material having a surface roughness (Ra) of 1 μm or ore at the portion which contacts the laminate.

4. A method for producing a sintered multi-layer ceramic body according to claim 1, wherein the insulating layer comprises at least one member selected from the group consisting of a glass, a glass ceramics and a composite material of the glass or glass ceramics with a ceramic filler.

5. A method for producing the sintered multi-layer ceramic body according to claim 1, wherein the ceramic insulating layer comprises a composite perovskite compound containing at least one material selected from the group consisting of barium titanate and lead.

6. A method for producing the sintered multi-layer ceramic body according to claim 1, wherein the conductor layer comprises at least one conductor material selected from the group consisting of Cu, Ag, Ag/Pd, Ag/Pt, Au, Ni, Pt, W, Mo, Pd and mixtures thereof.

7. The method according to claim 1, wherein the load placed on the laminate is a weight having a friction coefficient sufficient to eliminate dimensional change in the outermost surfaces.

8. The method according to claim 1, wherein the load on the laminate is a weight having a fraction coefficient sufficient to substantially eliminate dimensional change in the outermost surfaces.

9. The method according to claim 1, wherein a ceramic material constituting at least one green sheet is different from that of other green sheets.

10. The method according to claim 1, wherein at least a prefired ceramic sheet is placed on the laminate, prior to firing the laminate of the green sheets.

11. A method for producing a sintered multi-layer ceramic body according to claim 10, wherein the fired substrate in dimensionally stable at the firing temperature of the laminate and the surface roughness of the surface of the first substrate which contacts the unfired portion is greater than the other surface.

12. A method for producing a sintered multi-layer ceramic body according to claim 10, wherein at least one of the thermal conductivity, relative dielectric constant and strength of a material constituting the fired substrate is greater than those of the other insulating portion of the laminate after fired.

13. A method for producing a sintered multi-layer ceramic body according to claim 10, wherein the fired substrate is provided in the internal layer portion.

14. The method according to claim 1, wherein at least one member which is in contact with the surface of the laminate has a thermal expansion coefficient larger than that of the fired laminate.

15. The method according to claim 14, wherein the at least one member which is in contact with the surface of the laminate is made of a ceramic fiber reinforced material.

16. The method according to claim 1, wherein the sinterable mixture comprises an oxide of a metal for the conductor pattern, said oxide of the metal being turned into metal by heating in a reducing atmosphere.

17. The method according to claim 1, wherein the laminate is sandwiched between members having a large friction coefficient with respect to the laminate.

18. The method according to claim 1, wherein at least one of the members which is in contact with the surface of the laminate has a thermal expansion coefficient larger than that of the fired laminate.

19. The method according to claim 1, wherein at least one of the surfaces of the laminate is in contact with a material which is not sinterable under conditions of the firing of the laminate.

20. A method of producing a multi-layered ceramic substrate, which comprises the steps of:
   preparing a laminate of ceramic green sheets, said laminate having outermost surfaces and side faces each of said green sheets having a pattern of a sinterable mixture comprising conductor particles and an organic binder on at least one surface of said green sheet and through-holes filled with a sinterable conductor material, thereby connecting the patterns on adjacent surfaces of the green sheets;
   removing the organic binder in the green sheets, the sinterable mixture and the sinterable conductor material; and
   firing the laminate together with the sinterable mixture and the conductor material under a load such that dimensional change of the outermost surfaces in XY directions of the laminate compared with dimensions of outermost surfaces of a pre-fired laminate is substantially zero, while the side faces of the laminate each wholly curves outwardly to form a convex along a direction of the thickness of the laminate.

21. A method for producing a sintered multi-layer ceramic body according to claim 20, wherein the material is dimensionally stable at the firing temperature of the laminate and is porous.

22. A method for producing a sintered multi-layer ceramic body according to claim 20, wherein a plurality of the laminates are layered and fired substantially.

23. A method for producing a sintered multi-layer ceramic body according to claim 20, wherein the ceramic insulating layer comprises at least one material selected from the group consisting of alumina, mullite, aluminum nitride and boron nitride and at least one sintering aid which forms a liquid phase in sintering is added, 24. The method according to claim 20, wherein the side faces of the laminate are exposed in a sintering atmosphere during firing of the laminate.

25. The method according to claim 20, wherein the load placed on the laminate is a weight having a friction coefficient sufficient to eliminate dimensional change in the outermost surfaces.

26. The method according to claim 20, wherein the load placed on the laminate is a weight having a friction coefficient sufficient to substantially eliminate dimensional change in the outermost surfaces.

27. The method according to claim 20, wherein a ceramic material constituting at least one green sheet is different from that of other green sheets.

28. The method according to claim 20, wherein at least a prefired ceramic sheet is placed on the laminate, prior to firing the laminate of the green sheets.

29. In a method of producing a ceramic multi-layer printed board from a laminate of ceramic green sheets, said laminate having outermost surfaces and side faces, each of said green sheets having a pattern of a sinterable mixture comprising conductor particles and an organic binder on at least one surface of said green sheet and through-holes filled with a sinterable conductor material, the improvement which comprises the step of firing the laminate together with the sinterable mixture and the conductor material under a load such that the side faces of the laminate each wholly curves outwardly to form a convex along a direction of the thickness of the laminate, while a dimensional change of the outermost surface in XY directions of the laminate compared with dimensions of outermost surfaces of a pre-fired laminate is substantially zero.

30. A method for producing the sintered multi-layer ceramic body according to claim 29, wherein application of at least one of the pressure and the surface constraining force is carried out after completion of the heating step for binder burn-out.

31. The method according to claim 29, wherein the sinterable mixture comprises an oxide of a metal for the conductor pattern, said oxide of the metal being turned into metal by heating in a reducing atmosphere.

32. The method according to claim 29, wherein the laminate is sandwiched between members having a large friction coefficient with respect to the laminate.

33. The method according to claim 29, wherein at least one member which is in contact with the surfaces of the laminate is made of a ceramic fiber reinforced material.

34. The method according to claim 29, wherein the side faces of the laminate are exposed in a sintering atmosphere during firing of the laminate.

35. The method according to claim 29, wherein the load placed on the laminate is a weight having a friction coefficient sufficient to eliminate dimensional change in the outermost surfaces.

36. The method according to claim 29, wherein the load placed on the laminate is a weight having a friction coefficient sufficient to substantially eliminate dimensional change in the outermost surfaces.

37. The method according to claim 29, wherein a ceramic material constituting at least one of the green sheets is different from that of other green sheets.

38. The method according to claim 29, wherein at least one of the surfaces of the laminate is in contact with a material which is not sinterable under conditions of the firing of the laminate.

* * * * *